US009391290B2

(12) United States Patent
Watabe et al.

(10) Patent No.: US 9,391,290 B2
(45) Date of Patent: Jul. 12, 2016

(54) LIGHT-EMITTING DEVICE COMPRISING AN ORGANIC COMPOUND

(71) Applicant: Semiconductor Energy Laboratory Co., Ltd., Kanagawa-ken (JP)

(72) Inventors: Takeyoshi Watabe, Kanagawa (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 156 days.

(21) Appl. No.: 14/150,388

(22) Filed: Jan. 8, 2014

(65) Prior Publication Data

US 2014/0191220 A1    Jul. 10, 2014

(30) Foreign Application Priority Data

Jan. 10, 2013 (JP) ................................ 2013-002296

(51) Int. Cl.
*H01L 51/50* (2006.01)
*H01L 51/00* (2006.01)

(52) U.S. Cl.
CPC ......... *H01L 51/5016* (2013.01); *H01L 51/0059* (2013.01); *H01L 51/0072* (2013.01); *H01L 51/0074* (2013.01); *H01L 51/0085* (2013.01); (Continued)

(58) Field of Classification Search
CPC .................. H01L 2251/5384; H01L 2251/55; H01L 51/0059; H01L 51/0072; H01L 51/0085; H01L 51/5016
USPC .................................. 313/504–506; 428/690
See application file for complete search history.

(56) References Cited

U.S. PATENT DOCUMENTS 6,867,538 B2 * 3/2005 Adachi et al. ................. 313/503
6,911,271 B1   6/2005 Lamansky et al.
(Continued)

FOREIGN PATENT DOCUMENTS

CN    001454448 A    11/2003
CN    101006594 A    7/2007
(Continued)

OTHER PUBLICATIONS

Tokito, S. et al., "Confinement of Triplet Energy on Phosphorescent Molecules for Highly-Efficient Organic Blue-Light-Emitting Devices," Applied Physics Letters, Jul. 21, 2003, vol. 83, No. 3, pp. 569-571.
(Continued)

*Primary Examiner* — Anne Hines
(74) *Attorney, Agent, or Firm* — Husch Blackwell LLP

(57) ABSTRACT

A light-emitting element of the present invention can have sufficiently high emission efficiency with a structure including a host material being able to remain chemically stable even if a phosphorescent compound having higher emission energy is used as a guest material. The relation between the relative emission intensity and the emission time of light emission obtained from the host material and the guest material contained in a light-emitting layer is represented by a multicomponent decay curve. The relative emission intensity of the slowest component of the multicomponent decay curve becomes 1/100 for a short time within a range where the slowest component is not interfered with by quenching of the host material (the emission time of the slowest component is preferably less than or equal to 15 μsec); thus, sufficiently high emission efficiency can be obtained.

20 Claims, 23 Drawing Sheets

(52) U.S. Cl.
CPC ..... *H01L 2251/5384* (2013.01); *H01L 2251/55* (2013.01)

(56) References Cited

U.S. PATENT DOCUMENTS

| | | | |
|---|---|---|---|
| 6,939,624 | B2 | 9/2005 | Lamansky et al. |
| 7,374,828 | B2 | 5/2008 | Kondakova et al. |
| 7,381,479 | B2 | 6/2008 | Lamansky et al. |
| 7,474,048 | B2 * | 1/2009 | Forrest et al. ............... 313/504 |
| 7,553,560 | B2 | 6/2009 | Lamansky et al. |
| 7,906,226 | B2 | 3/2011 | Matsuura et al. |
| 8,105,701 | B2 | 1/2012 | Matsuura et al. |
| 8,470,455 | B2 | 6/2013 | Matsuura et al. |
| 8,643,268 | B2 | 2/2014 | Ogiwara et al. |
| 8,883,323 | B2 | 11/2014 | Kawamura et al. |
| 8,940,411 | B2 * | 1/2015 | Shiang et al. ............... 428/690 |
| 2002/0182441 | A1 | 12/2002 | Lamansky et al. |
| 2004/0202893 | A1 * | 10/2004 | Abe ............................ 428/690 |
| 2006/0040132 | A1 | 2/2006 | Liao et al. |
| 2006/0066225 | A1 | 3/2006 | Kishino et al. |
| 2008/0149923 | A1 | 6/2008 | Ohsawa et al. |
| 2008/0309227 | A1 * | 12/2008 | Che ............................ 313/504 |
| 2011/0101379 | A1 * | 5/2011 | Sugisawa et al. ............. 257/79 |
| 2012/0126205 | A1 | 5/2012 | Kawamura et al. |
| 2012/0126208 | A1 | 5/2012 | Kawamura et al. |
| 2012/0248968 | A1 | 10/2012 | Ogiwara et al. |

FOREIGN PATENT DOCUMENTS

| | | |
|---|---|---|
| CN | 101541916 | 9/2009 |
| EP | 2 493 269 A1 | 8/2012 |
| EP | 2 566 302 A1 | 3/2013 |
| EP | 2690681 A | 1/2014 |
| JP | 2004-506305 | 2/2004 |
| JP | 2006-128632 A | 5/2006 |
| JP | 2007-515788 | 6/2007 |
| JP | 2007-305783 A | 11/2007 |
| JP | 2008-511100 | 4/2008 |
| JP | 2008-160098 A | 7/2008 |
| JP | 2010-182699 | 8/2010 |
| JP | 2010-184910 A | 8/2010 |
| KR | 2007-0043014 A | 4/2007 |
| KR | 10-0884039 | 2/2009 |
| KR | 2009-0096478 A | 9/2009 |
| KR | 10-1134412 B | 4/2012 |
| TW | 593625 B | 6/2004 |
| TW | 200840408 | 10/2008 |
| TW | 201248965 | 12/2012 |
| WO | WO 02/15645 A1 | 2/2002 |
| WO | WO 2006/023322 A1 | 3/2006 |
| WO | WO-2008/065975 | 6/2008 |
| WO | WO-2012/133188 | 10/2012 |

OTHER PUBLICATIONS

Tanaka.H et al., "Efficient green thermally activated delayed fluorescence (TADF) from a phenoxazine-triphenyltriaine (PXZ-TRZ) derivative", Chemical Communications, Dec. 4, 2012, vol. 48, No. 93, pp. 11392-11394, The Royal Society of Chemistry 2012.

International Search Report (Application No. PCT/JP2013/085358) Dated Feb. 25, 2014.

Written Opinion (Application No. PCT/JP2013/085358) Dated Feb. 25, 2014.

* cited by examiner

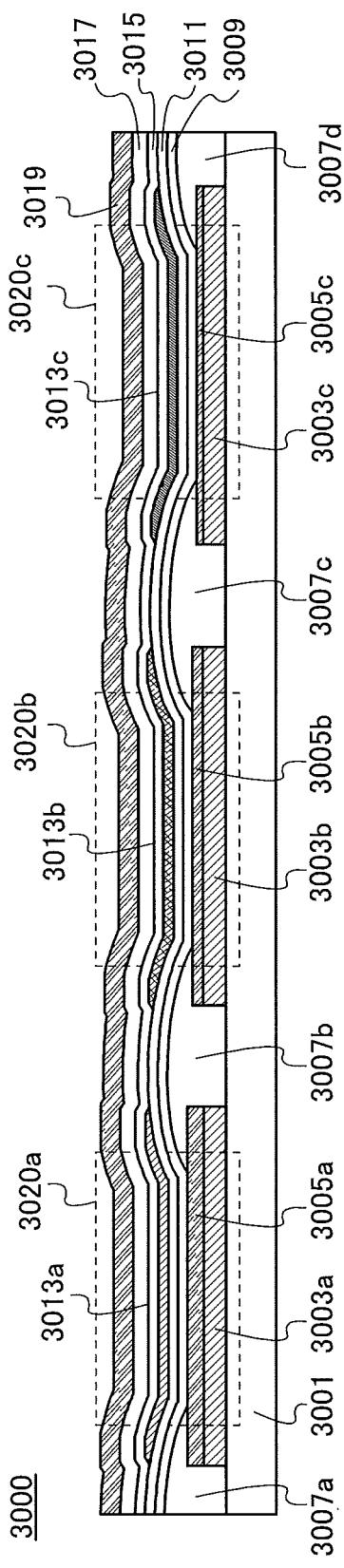
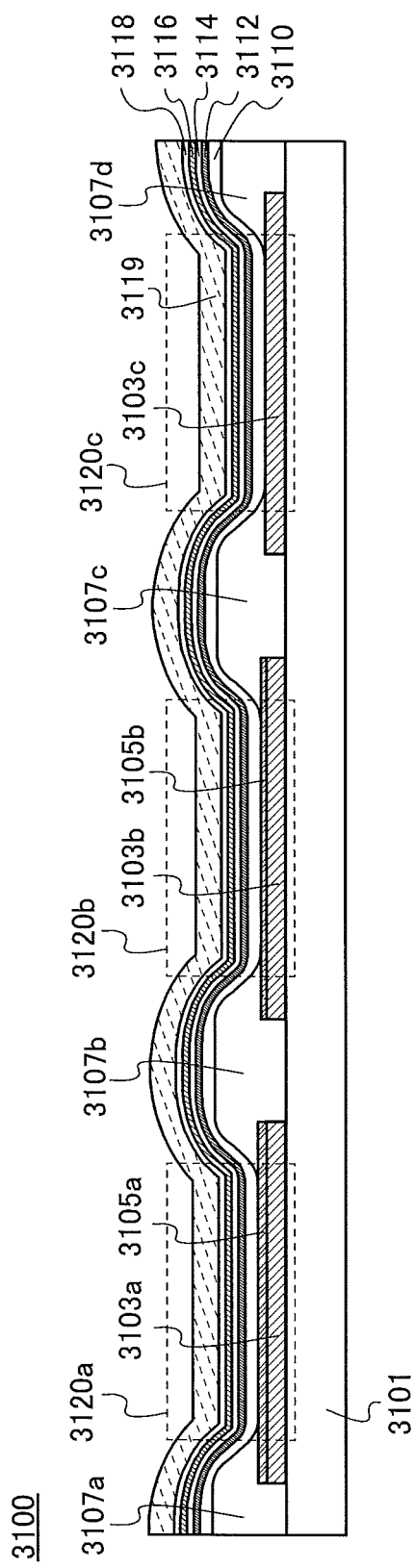
FIG. 19A
FIG. 19B

LIGHT-EMITTING DEVICE COMPRISING AN ORGANIC COMPOUND

TECHNICAL FIELD

The present invention relates to an object, a method, a manufacturing method, a process, a machine, manufacture, or a composition of matter. In particular, the present invention relates to, for example, a semiconductor device, a display device, a light-emitting device, a power storage device, a driving method thereof, or a manufacturing method thereof. Specifically, one embodiment of the present invention relates to a light-emitting element in which an organic compound capable of providing light emission by application of an electric field is provided between a pair of electrodes, and also relates to a light-emitting device, an electronic device, and a lighting device including such a light-emitting element.

BACKGROUND ART

A light-emitting element using an organic compound as a luminous body, which has features such as thinness, lightness, high-speed response, and DC drive at low voltage, is expected to be applied to a next-generation flat panel display. In particular, a display device in which light-emitting elements are arranged in a matrix is considered to have advantages in a wide viewing angle and excellent visibility over a conventional liquid crystal display device.

A light-emitting element is said to have the following light emission mechanism: when voltage is applied between a pair of electrodes with an EL layer containing a light-emitting substance provided therebetween, electrons injected from a cathode and holes injected from an anode are excited in a light emission center of the EL layer, and energy is released and light is emitted when the excited state returns to a ground state. There can be two types of the excited states generated in the case of using an organic compound as a light-emitting substance: a singlet excited state and a triplet excited state. Luminescence from the singlet excited state (S1) is referred to as fluorescence, and luminescence from the triplet excited state (T1) is referred to as phosphorescence. The statistical generation ratio of the excited states in the light-emitting element is considered to be S1:T1=1:3.

Development for improving element characteristics has been conducted; for example, a light-emitting element having a structure utilizing not only fluorescence but also phosphorescence has been developed. In a light-emitting layer of the light-emitting element, a host material and a guest material are contained, and a phosphorescent material exhibiting high energy emission is used as the guest material (e.g., see Patent Document 1).

REFERENCE

Patent Document

[Patent Document 1] Japanese Published Patent Application No. 2010-182699

DISCLOSURE OF INVENTION

In general, it is thought that to improve the emission efficiency of a light-emitting element using a host material and a guest material, the T1 level (the level in the triplet excited state) of the host material is preferably higher than that of the guest material. However, in the case where a phosphorescent compound having high emission energy (e.g., a blue phosphorescent compound) is used as a guest material, the T1 level of a host material needs to be higher than that in the case where a phosphorescent compound having lower emission energy (e.g., a green or red phosphorescent compound) is used as a guest material; thus, there is a problem in that the host material becomes chemically unstable.

An object of one embodiment of the present invention is to provide a chemically stable light-emitting device. Another object of one embodiment of the present invention is to provide a light-emitting device having high emission efficiency. Another object of one embodiment of the present invention is to provide a highly reliable light-emitting device. Another object of one embodiment of the present invention is to provide a light-emitting device in which image burn-in is unlikely to occur. Another object of one embodiment of the present invention is to provide a light-emitting device in which delayed light emission is performed. Another object of one embodiment of the present invention is to provide a novel light-emitting device. Another object of one embodiment of the present invention is to provide an excellent light-emitting device.

Note that the description of these objects does not disturb the existence of other objects. Note that in one embodiment of the present invention, there is no need to achieve all of the objects. Other objects will be apparent from the description of the specification, the drawings, the claims, and the like and other objects can be derived from the description of the specification, the drawings, the claims, and the like.

In view of the above background, a light-emitting element of one embodiment of the present invention can have sufficiently high emission efficiency with a structure including a host material being able to remain chemically stable even if a phosphorescent compound having higher emission energy is used as a guest material. The structure is as follows: a light-emitting layer in the light-emitting element contains at least a host material and a guest material; the relation between the relative emission intensity and the emission time of light emission obtained from these materials (e.g., photoluminescence (PL) by photoexcitation or electroluminescence (EL) by electric field excitation) at the exciton concentration in a range where concentration quenching does not occur is represented by a multicomponent decay curve; it is preferable that the relative emission intensity ($=E(t)/E_0$) of the slowest component of the decay curve become 1/100 for a short time within a range where the slowest component is not interfered with by quenching of the host material; that is, the emission time of the slowest component is less than or equal to 15 μsec, preferably less than or equal to 10 μsec, more preferably less than or equal to 5 μsec.

Note that the multicomponent decay curve is expressed by Formula 1 below.

[FORMULA 1]

$$E(t)/E_0 = \sum_{i=1}^{n} A_i \exp(-t/\tau_i) \tag{1}$$

(Note that $E_0$ indicates an initial emission intensity, $E(t)$ indicates an emission intensity at time (t), A is a constant, τ indicates a lifetime, and n indicates the number of components of a decay curve.)

Under the above conditions, even when the T1 level of a host material is lower than the T1 level of a guest material, energy transfer from the host material to the guest material is possible. Since the T1 level of the host material is not necessarily higher than that of the guest material, a chemically stable material can be used as the host material.

Accordingly, one embodiment of the present invention is a light-emitting element including a light-emitting layer containing at least a host material and a guest material. In the light-emitting layer that has been irradiated with a pulsed laser (the output level is set not to cause concentration quenching), relation between the relative emission intensity and the emission time is represented by a multicomponent decay curve, and the emission time it takes for the relative emission intensity of the slowest component of the decay curve to become 1/100 is less than or equal to 15 μsec, preferably less than or equal to 10 μsec, more preferably less than or equal to 5 μsec.

Another embodiment of the present invention is a light-emitting element including at least a light-emitting layer between a pair of electrodes. The light-emitting layer contains two or more kinds of organic compounds. Two or more components that show the relation between the relative emission intensity and the emission time at the time of light emission are observed when the relative emission intensity becomes 1/100. The time it takes for the relative emission intensity of the slowest component of the multicomponent decay curve to become 1/100 is less than or equal to 15 μsec, preferably less than or equal to 10 μsec, more preferably less than or equal to 5 μsec.

Another embodiment of the present invention is a light-emitting element including at least a light-emitting layer between a pair of electrodes. The light-emitting layer contains at least a first organic compound (a host material) and a second organic compound (a guest material). The second organic compound is an organic metal complex. The T1 level of the first organic compound is lower than that of the second organic compound. Two or more components that show the relation between the relative emission intensity and the emission time are observed when the relative emission intensity becomes 1/100. The emission time it takes for the relative emission intensity of the slowest component of the multicomponent decay curve to become 1/100 is less than or equal to 15 μsec, preferably less than or equal to 10 μsec, more preferably less than or equal to 5 μsec.

Note that in each of the above structures, an organic compound whose T1 level is lower than that of the guest material can be used as the host material; thus, the light-emitting element can be fabricated without using a chemically unstable organic compound as the host material even.

In any of the above structures, the host material is preferably selected such that the guest material such that the T1 level of the host material is lower than that of the guest material, and the difference in T1 level is greater than or equal to 0 eV and less than or equal to 0.2 eV. Accordingly, a chemically stable host material can be used without decreasing emission efficiency, leading to a long-lifetime light-emitting element.

Other embodiments of the present invention are not only a light-emitting device including the light-emitting element but also an electronic device and a lighting device each including the light-emitting device. Accordingly, a light-emitting device in this specification refers to an image display device or a light source (including a lighting device). In addition, the light-emitting device includes, in its category, all of a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

A light-emitting element of one embodiment of the present invention can have high emission efficiency. A light-emitting element of one embodiment of the present invention can have a long lifetime by including a chemically stable host material in a light-emitting layer. A light-emitting device of one embodiment of the present invention can have high reliability by including the light-emitting element. An electronic device and a lighting device of one embodiment of the present invention can have high reliability by including the light-emitting device.

BRIEF DESCRIPTION OF DRAWINGS

FIGS. 19A and 19B each illustrate a light-emitting device of one embodiment of the present invention.

BEST MODE FOR CARRYING OUT THE INVENTION

Hereinafter, embodiments of the present invention will be described with reference to the drawings. Note that the present invention is not limited to the following description, and modes and details thereof can be modified in various ways without departing from the spirit and the scope of the present invention. Therefore, the present invention should not be construed as being limited to the description in the following embodiments.

(Embodiment 1)

In this embodiment, described are a concept and a specific structure of a light-emitting element of one embodiment of the present invention. The light-emitting element includes a host material capable of remaining chemically stable even if a phosphorescent compound having high emission energy is used as a guest material.

In a light-emitting element of one embodiment of the present invention, a light-emitting layer is provided between a pair of electrodes, and the light-emitting layer contains at least a host material and a guest material (the exciton concentration is in a range where concentration quenching does not occur). The relation between the relative emission intensity and the emission time of light emission obtained from these materials (e.g., photoluminesence (PL) by photoexcitation or electroluminescence (EL) by electric field excitation) is represented by a multicomponent decay curve. The relative emission intensity of the slowest component of the decay curve becomes 1/100 for a short time within a range where the slowest component is not interfered with by quenching of the host material (preferably less than or equal to 15 μsec); thus, sufficiently high emission efficiency can be obtained.

At this time, energy transfer is possible even in the case where the T1 level of the host material is lower than that of the guest material. Since the T1 level of the host material is not necessarily higher than that of the guest material, a chemically stable material can be used as the host material. Accordingly, in one embodiment of the present invention, a host material whose T1 level is lower than that of a guest material can be used.

A structure of these materials in one embodiment of the present invention is described with reference to FIGS. 1A and 1B.

Figure 1A:
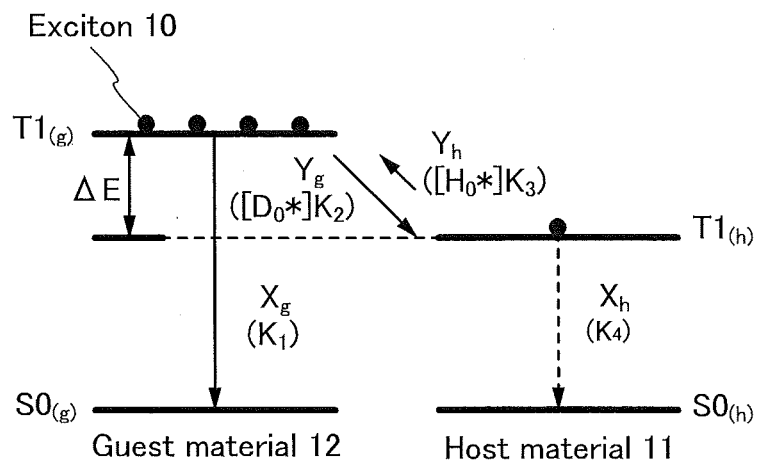
FIGS. 1A and 1B illustrate a concept of one embodiment of the present invention.

FIG. 1A illustrates relation between an energy state of excitons in a host material 11 and an energy state of excitons in a guest material 12. A light-emitting layer contains at least the host material 11 and the guest material 12. The triplet excited state of the guest material 12 is a T1($g$) level, and an exciton 10 generated from the guest material 12 is located at this level. The triplet excited state of the host material 11 is a T1($h$) level that is lower than the T1($g$) level of the guest material 12 by ΔE(eV) energy.

In this case, an excitation energy at the T1($g$) level of the guest material 12 transfers (Y$_g$) to the T1($h$) level of the host material 11 at a rate of [D$_0$*]×K$_2$. Note that [D$_0$*] represents the concentration of excitons in the guest material, and K$_2$ represents a rate constant of excitation energy transfer from the guest material 12 to the host material 11. Furthermore, excitation energy can transfer (Y$_h$) from the T1($h$) level of the host material 11 to the T1($g$) level of the guest material 12 at a rate of [H$_0$*]×K$_3$. Note that [H$_0$*] represents the concentration of excitons in the host material, and K$_3$ represents a rate constant of excitation energy transfer from the host material 11 to the guest material 12. This physically disadvantageous energy transfer from the low level to the high level (hereinafter, referred to as reverse energy transfer) can occur because excitons are activated by energy at room temperature. However, just after photoexcitation or electrical exitation, the rate of excitation energy transfer from the T1($g$) level to the T1($h$) level is extremely higher than the rate of reverse energy transfer from the T1($h$) level to the T1($g$) level. Therefore, it can be regarded that reverse energy transfer from the host material 11 to the guest material 12 hardly occurs. Note that in FIGS. 1A and 1B, K$_1$ represents a rate constant of transfer from the T1($g$) level to an S0($g$) level of the guest material 12, and K$_4$ represents a rate constant of transfer from the T1($h$) level to an S0($h$) level of the host material 11.

Figure 1B:
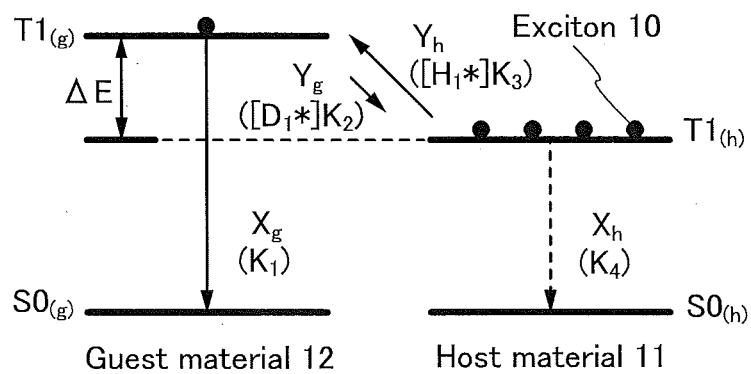

However, when the excitation energy transfer (Y$_g$) from the T1($g$) level to the T1($h$) level proceeds, the concentration of excitons at the T1($h$) level increases as illustrated in FIG. 1B, so that the excitation energy transfer (Y$_h$) from the T1($h$) level to the T1($g$) level occurs effectively. At this time, for effective reverse energy transfer, it is important that an energy difference (ΔE) between the T1($g$) level and the T1($h$) level is not so large. Here, combination of the host material 11 and the guest material 12 which satisfies the formula 0<ΔE<0.2 eV is preferable.

When the above-mentioned excitation energy transfers occur, radiative transition (X$_g$) from the T1($g$) level to the S0($g$) level of the guest material 12 and non-radiative transition (X$_h$) from the T1($h$) level to the S0($h$) level of the host material 11 also occur at the same time. Note that in FIGS. 1A and 1B, K$_1$ represents a transition rate constant from the T1($g$) level to the S0($g$) level of the guest material 12, and K$_4$ represents a transition rate constant from the T1($h$) level to the S0($h$) level of the host material 11. At this time, it is also important for high efficiency light emission that the rate of the non-radiative transition (X$_h$) be much lower than that of the radiative transition (X$_g$). It is preferable that the radiative transition (X$_g$) be faster than 0.2 (μsec)$^{-1}$, and the non-radiative transition (X$_h$) be slower than 10 (msec)$^{-1}$.

That is, the rate of reverse energy transfer is made sufficiently higher than that of non-radiative transition of the host material, and the rate of radiative transition of the guest material is made sufficiently higher than that of non-radiative transition of the host material, whereby high efficiency light emission can be obtained.

As described above, a light-emitting element of one embodiment of the present invention also utilizes energy that reversely transfers from a low level for its light emission, and thus has a feature in that a curve representing an emission time obtained by PL measurement is a multicomponent decay curve. The relative emission intensity of the slowest component of the decay curve becomes 1/100 for a short time within a range where the slowest component is not interfered with by quenching of the host material, that is, the emission time of the slowest component is less than or equal to 15 μsec, preferably less than or equal to 10 μsec, more preferably less than or equal to 5 μsec; thus, sufficiently high emission efficiency can be obtained.

Note that in addition to the above-mentioned state, a measurement result may show a multicomponent decay curve in a state where the power density of a pulsed laser is set high and the exciton concentration is high. This is because the exciton concentration becomes high and interaction among excitons leads to the triplet-triplet extinction. This phenomenon is called concentration quenching. The measurement needs to be performed in a state where the power density of a pulsed laser is set low and the exciton concentration is low to avoid influence of concentration quenching.

Next, a structure of a light-emitting element of one embodiment of the present invention is described with reference to FIG. 2.

Figure 2:
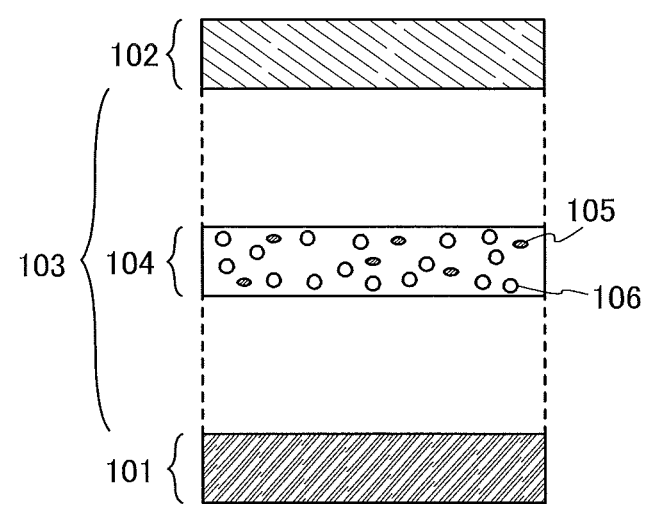
FIG. 2 illustrates a structure of a light-emitting element.

As illustrated in FIG. 2, the light-emitting element of one embodiment of the present invention has a structure in which a light-emitting layer 104 containing a first organic compound and a second organic compound is provided between a pair of electrodes (an anode 101 and a cathode 102). The light-emitting layer 104 is one of functional layers included in an EL layer 103 that is in contact with the pair of electrodes. The EL layer 103 can include, in addition to the light-emitting layer 104, any of a hole-injection layer, a hole-transport layer, an electron-transport layer, an electron-injection layer, and the like as appropriate at desired positions. Note that the light-emitting layer 104 contains at least a first organic compound 105 serving as a host material and a second organic compound 106 serving as a guest material.

A material having an excellent hole-transport property or a material having an excellent electron-transport property can be used as the first organic compound 105 serving as a host material.

Examples of the material having an excellent hole-transport property that can be used as the first organic compound 105 include aromatic amine compounds such as 4-(1-naphthyl)-4'-phenyl-4''-(9-phenyl-9H-carbazol-3-yl)triphenylamine (abbreviation: PCBBiNB), 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N'-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N-(3-methylphenyl)-N-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2). In addition, the following compounds including a carbazole skeleton can be used, for example: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances mentioned here are mainly ones that have a hole mobility of $10^{-6}$ cm$^2$/Vs or higher. Note that any substance other than the above substances may be used as long as it has a hole-transport property.

Examples of the material having an excellent electron-transport property that can be used as the first organic compound 105 include the followings: heterocyclic compounds having polyazole skeletons, such as 2-(4-biphenylyl)-5-(4-tert-butylphenyl)-1,3,4-oxadiazole (abbreviation: PBD), 3-(4'-tert-butylphenyl)-4-phenyl-5-(4''-biphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having quinoxaline skeletons or dibenzoquinoxaline skeletons, such as 2-[3-(dibenzothiophen-4-yl)phenyl]dibenzo[f,h]quinoxaline (abbreviation: 2mDBTPDBq-II), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3'-(dibenzothiophen-4-yl)biphenyl-3-yl]dibenzo[f,h]quinoxaline (abbreviation: 2mDBTBPDBq-II), and 2-[3'-(9H-carbazol-9-yl)biphenyl-3-yl]dibenzo[f,h]quinoxaline (abbreviation: 2mCzBPDBq); heterocyclic compounds having diazine skeletons (pyrimidine skeletons or pyrazine skeletons), such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); and heterocyclic compounds having pyridine skeletons, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), and 3,3',5,5'-tetra[(m-pyridyl)-phen-3-yl]biphenyl (abbreviation: BP4lmPy). Among the above-described compounds, the heterocyclic compounds having quinoxaline skeletons or dibenzoquinoxaline skeletons, the heterocyclic compounds having diazine skeletons, and the heterocyclic compounds having pyridine skeletons have high reliability and are thus preferable. Other examples of the material having an excellent electron-transport property include the followings: triaryl phosphine oxides, such as phenyl-di(1-pyrenyl)phosphine oxide (abbreviation: POPy$_2$), spiro-9,9'-bifluoren-2-yl-diphenylphosphine oxide (abbreviation: SPPO1), 2,8-bis(diphenylphosphoryl)dibenzo[b,d]thiophene (abbreviation: PPT), and 3-(diphenylphosphoryl)-9-[4-(diphenylphosphoryl)phenyl]-9H-carbazole (abbreviation: PPO21); and triaryl borane such as tris[2,4,6-trimethyl-3-(3-pyridyl)phenyl]borane (abbreviation: 3TPYMB). The substances mentioned here have an electron-transport property and are mainly ones that have an electron mobility of $10^{-6}$ cm$^2$/Vs or more. Note that any substance other than the above substances may be used as long as it has an electron-transport property.

Note that the light-emitting layer may contain a third organic compound in addition to the first organic compound (the host material) and the second organic compound (the guest material). To obtain high emission efficiency by adjustment of a balance between holes and electrons in the light-emitting layer, when the first organic compound has a hole-transport property, the third organic compound preferably has an electron-transport property. In contrast, when the first organic compound has an electron-transport property, the third organic compound preferably has a hole-transport property. In either case, the T1($h$) level of the first organic compound is preferably lower than the T1($g$) level of the second organic compound. Note that the T1 level of the third organic compound may be higher than the T1(g) level. This is because energy at the T1 level of the third organic compound is rapidly collected to energy at the T1(h) level (located at lower than the T1 level of the third organic compound) of the first organic compound.

As the second organic compound 106 serving as a guest material, an organic metal complex (a phosphorescent compound) that is a light-emitting substance converting triplet excitation energy into light emission can be used, for example.

Examples of the material that can be used as the second organic compound 106 include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N,$C^{2'}$]iridium(III)picolinate (abbreviation: [Ir(CF$_3$ppy)$_2$(pic)]), bis[2-(4',6'-difluorophenyl)pyridinato-N,$C^{2'}$]iridium(III) acetylacetonate (abbreviation: FIracac), tris(2-phenylpyridinato)iridium(III) (abbreviation: [Ir(ppy)$_3$]), bis(2-phenylpyridinato)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), bis(2,4-diphenyl-1,3-oxazolato-N,$C^{2'}$)iridium(III) acetylacetonate (abbreviation: [Ir(dpo)$_2$(acac)]), bis{2-[4'-(perfluorophenyl)phenyl]pyridinato-N,$C^{2'}$}iridium(III) acetylacetonate (abbreviation: [Ir(p-PF-ph)$_2$(acac)]), bis(2-phenylbenzothiazolato-N,$C^{2'}$)iridium(III)acetylacetonate (abbreviation: [Ir(bt)$_2$(acac)]), bis[2-(2'-benzo[4,5-α]thienyl)pyridinato-N,$C^{3'}$]iridium(III) acetylacetonate (abbreviation: [Ir(btp)$_2$(acac)]), bis(1-phenylisoquinolinato-N,$C^{2'}$)iridium(III) acetylacetonate (abbreviation: [Ir(piq)$_2$(acac)]), (acetylacetonato)bis[2,3-bis(4-fluorophenyl)quinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), 2,3,7,8,12,13,17,18-octaethyl-21H,23H-porphineplatinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(I) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

In the light-emitting layer of the light-emitting element described in this embodiment, the host material and the guest material contained in the light-emitting layer are selected to satisfy the following: the relation between the relative emission intensity and the emission time of light emission obtained from these materials (e.g., photoluminesence (PL) by photoexcitation or electroluminescence (EL) by electric field excitation) is represented by a multicomponent decay curve; the relative emission intensity of the slowest component of the multicomponent decay curve becomes 1/100 for a short time within a range where the slowest component is not interfered with by quenching of the host material, that is, the emission time of the slowest component is less than or equal to 15 μsec, preferably less than or equal to 10 μsec, more preferably less than or equal to 5 μsec.

In the light-emitting element having the above feature, energy transfer is possible even in the case where the T1 level of the host material is lower than that of the guest material. Since the T1 level of the host material is not necessarily higher than that of the guest material, a chemically stable material can be used as the host material.

Accordingly, in this embodiment, a chemically stable material can be used as a host material in a light-emitting layer of a light-emitting element; thus, the light-emitting element can have a long lifetime. In the structure of this embodiment, when the T1 level of the host material is lower than that of the guest material, delayed light emission associated with reverse energy transfer occurs. Since a host material in the T1 level is non-radiative at room temperature, it is concerned that a light-emitting layer exhibiting delayed light emission has low efficiency. However, in the above range, the rate of reverse energy transfer and the rate of radiative transition of the guest material are sufficiently higher than the rate of non-radiative transition of the host material (a radiationless deactivation rate of the host material); thus, element characteristics are not affected and a light-emitting element having high emission efficiency can be obtained.

Note that in this embodiment, the example in which the relation between the relative emission intensity and the emission time is represented by a multicomponent decay curve is described, but one embodiment of the present invention is not limited thereto. Depending on circumstances or conditions, the relation between the relative emission intensity and the emission time of one embodiment of the present invention is not represented by a multicomponent decay curve in some cases.

(Embodiment 2)

In this embodiment, an example of a light-emitting element of one embodiment of the present invention is described with reference to FIG. 3.

Figure 3:
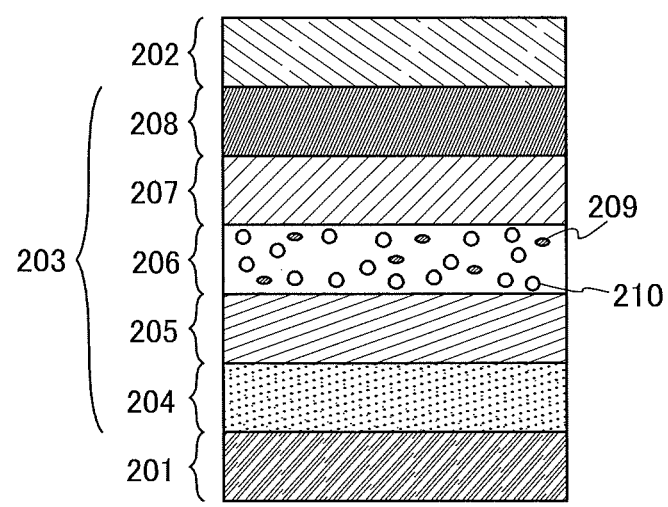
FIG. 3 illustrates a structure of a light-emitting element.

In the light-emitting element described in this embodiment, as illustrated in FIG. 3, an EL layer 203 including a light-emitting layer 206 is provided between a pair of electrodes (a first electrode (anode) 201 and a second electrode (cathode) 202), and the EL layer 203 includes a hole-injection layer 204, a hole-transport layer 205, an electron-transport layer 207, an electron-injection layer 208, and the like in addition to the light-emitting layer 206.

As in the light-emitting element described in Embodiment 1, the light-emitting layer 206 contains at least the first organic compound 209 serving as a host material and the second organic compound 210 serving as a guest material. Since the same substances described in Embodiment 1 can be used as the first organic compound 209 and the second organic compound 210, and description thereof is omitted.

In addition to the first organic compound 209 serving as a host material and the second organic compound 210 serving as a guest material, the light-emitting layer 206 may also contain the third organic compound having a property opposite to the property of the first organic compound 209 (a hole-transport property or an electron-transport property).

Next, a specific example in manufacturing the light-emitting element described in this embodiment is described.

For the first electrode (anode) 201 and the second electrode (cathode) 202, a metal, an alloy, an electrically conductive compound, a mixture thereof, or the like can be used. Specifically, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), or titanium (Ti) can be used. In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (e.g., MgAg or AlLi), a rare earth metal such as europium (Eu) or ytterbium (Yb), an alloy containing such an element, or graphene can be used. The first electrode (anode) 201 and the second electrode (cathode) 202 can be formed by, for example, a sputtering method or an evaporation method (including a vacuum evaporation method).

Examples of a material having an excellent hole-transport property that can be used for the hole-injection layer 204 and the hole-transport layer 205 include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N'-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1). Alternatively, the following carbazole derivatives can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-Carbazole (abbreviation: CzPA). The substances mentioned here are mainly materials having a hole mobility of $10^{-6}$ cm$^2$/Vs or higher. Note that substances other than the above substances may be used as long as the hole-transport property is higher than the electron-transport property.

Alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can be used.

As examples of an acceptor substance that is used for the hole-injection layer 204, a transition metal oxide or an oxide of a metal belonging to any of Group 4 to Group 8 of the periodic table can be given. Specifically, molybdenum oxide is particularly preferable.

Note that for the hole-transport layer 205 in contact with the light-emitting layer 206, a compound similar to the organic compound contained in the light-emitting layer is preferably used. With this structure, the hole-injection barrier between the hole transport layer 205 and the light-emitting layer 206 can be reduced, which can increase emission efficiency and reduce driving voltage. That is, a light-emitting element having a small decrease in power efficiency due to voltage loss even in the case of emitting light with high luminance can be obtained. A particularly preferable mode for reducing the hole-injection barrier is a structure in which the hole-transport layer 205 contains the same organic compound as the light-emitting layer.

The electron-transport layer 207 is a layer containing a material having an excellent electron-transport property. For the electron-transport layer 207, a metal complex such as tris(8-quinolinolato)aluminum(III) (abbreviation: Alq$_3$), tris(4-methyl-8-quinolinolato)aluminum(II) (abbreviation: Almq$_3$), bis(10-hydroxybenzo[h]quinolinato)beryllium(II) (abbreviation: BeBq$_2$), BAlq, Zn(BOX)$_2$, or bis[2-(2-hydroxyphenyl)benzothiazolato]zinc(II) (abbreviation: Zn(BTZ)$_2$) can be used. Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)] (abbreviation: PF-BPy) can be used. The substances given here are mainly ones having an electron mobility of $10^{-6}$ cm$^2$/Vs or higher. Note that any substance other than the above substances may be used for the electron-transport layer 207 as long as the electron-transport property is higher than the hole-transport property.

The electron-transport layer 207 is not limited to a single layer, and may be a stack of two or more layers containing any of the above substances.

The electron-injection layer 208 is a layer containing a substance having a high electron-injection property. For the electron-injection layer 208, an alkali metal, an alkaline earth metal, or a compound thereof, such as lithium fluoride (LiF), cesium fluoride (CsF), calcium fluoride (CaF$_2$), or lithium oxide (LiOx), can be used. A rare earth metal compound like erbium fluoride (ErF$_3$) can also be used. Any of the above substances for forming the electron-transport layer 207 can also be used.

A composite material in which an organic compound and an electron donor (donor) are mixed may also be used for the electron-injection layer 208. Such a composite material is excellent in an electron-injection property and an electron-transport property because electrons are generated in the organic compound by the electron donor. In this case, the organic compound is preferably a material excellent in transporting the generated electrons. Specifically, for example, the above materials for forming the electron-transport layer 207 (e.g., a metal complex or a heteroaromatic compound) can be used. As the electron donor, a substance exhibiting an electron-donating property with respect to the organic compound may be used. Specific examples are an alkali metal, an alkaline earth metal, and a rare earth metal are preferable, and lithium, cesium, magnesium, calcium, erbium, and ytterbium. Further, an alkali metal oxide or an alkaline earth metal oxide is preferable, and for example, lithium oxide, calcium oxide, and barium oxide can be given. A Lewis base such as magnesium oxide can also be used. An organic compound such as tetrathiafulvalene (abbreviation: TTF) can also be used.

Note that each of the above hole-injection layer 204, hole-transport layer 205, light-emitting layer 206, electron-transport layer 207, and electron-injection layer 208 can be formed by, for example, an evaporation method (e.g., a vacuum evaporation method), an inkjet method, or a coating method.

Light emission obtained in the light-emitting layer 206 of the above-described light-emitting element is extracted to the outside through either the first electrode 201 or the second electrode 202 or both. Therefore, either the first electrode 201 or the second electrode 202 in this embodiment, or both, is an electrode having a light-transmitting property.

Note that the light-emitting element described in this embodiment is one embodiment of the present invention and is particularly characterized by the structure of the light-emitting layer. Therefore, when the structure described in this embodiment is employed, a passive matrix light-emitting device, an active matrix light-emitting device, and the like can be manufactured. Each of these light-emitting devices is included in the present invention.

Note that there is no particular limitation on the structure of the FET in the case of manufacturing the active matrix light-emitting device. For example, a staggered FET or an inverted staggered FET can be used as appropriate. Further, a driver circuit formed over an FET substrate may be formed using either an n-channel FET or a p-channel FET or both. Furthermore, there is no particular limitation on a semiconductor material used for the FET and the crystallinity of the semiconductor material. Examples of the semiconductor material include element semiconductors such as silicon, germanium, tin, selenium, and tellurium; compound semiconductors such as GaAs, GaP, InSb, ZnS, and CdS; and oxide semiconductors such as $SnO_2$, ZnO, $Fe_2O_3$, $V_2O_5$, $TiO_2$, NiO, $Cr_2O_3$, $Cu_2O$, $MnO_2$, MnO, and InGaZnO (including the ones having different atomic ratios). The crystallinity of the semiconductor material can be, for example, amorphous, single crystal, polycrystalline, microcrystalline, or a mixed phase structure of these. A semiconductor material having any of the above crystallinity can be used.

Note that the structure described in this embodiment can be used in combination with any of the structures described in the other embodiments, as appropriate.

(Embodiment 3)

In this embodiment, as one embodiment of the present invention, a light-emitting element (hereinafter referred to as tandem light-emitting element) in which a charge generation layer is provided between a plurality of EL layers is described.

Figure 4A:
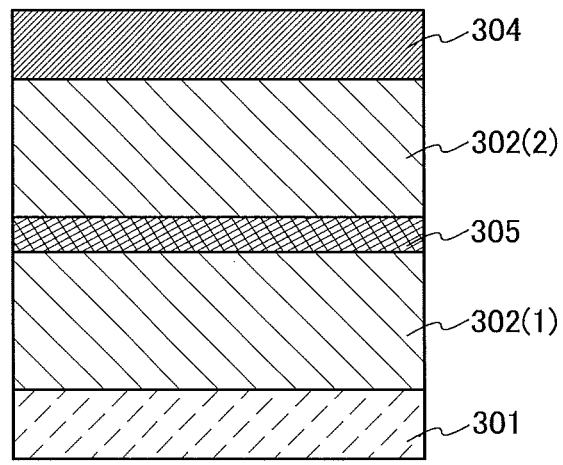
FIGS. 4A and 4B illustrate structures of light-emitting elements.

The light-emitting element described in this embodiment is a tandem light-emitting element including a plurality of EL layers (a first EL layer 302(1) and a second EL layer 302(2)) between a pair of electrodes (a first electrode 301 and a second electrode 304) as illustrated in FIG. 4A.

In this embodiment, the first electrode 301 functions as an anode, and the second electrode 304 functions as a cathode. Note that the first electrode 301 and the second electrode 304 can have structures similar to those described in Embodiment 2. In addition, all or any of the plurality of EL layers (the first EL layer 302(1) and the second EL layer 302(2)) may have structures similar to those described in Embodiment 2. In other words, the structures of the first EL layer 302(1) and the second EL layer 302(2) may be the same or different from each other and can be similar to those of the EL layers described in Embodiment 2.

A charge generation layer 305 is provided between the plurality of EL layers (the first EL layer 302(1) and the second EL layer 302(2)). The charge-generation layer 305 has a function of injecting electrons into one of the EL layers and injecting holes into the other of the EL layers when voltage is applied between the first electrode 301 and the second electrode 304. In this embodiment, when voltage is applied such that the potential of the first electrode 301 is higher than that of the second electrode 304, the charge-generation layer 305 injects electrons into the first EL layer 302(1) and injects holes into the second EL layer 302(2).

Note that for improving light extraction efficiency, the charge-generation layer 305 preferably has a property of transmitting visible light (specifically, the charge-generation layer 305 preferably has a visible light transmittance of 40% or higher). Further, the charge-generation layer 305 functions even when it has lower conductivity than the first electrode 301 or the second electrode 304.

The charge-generation layer 305 may have either a structure in which an electron acceptor (acceptor) is added to an organic compound having an excellent hole-transport property or a structure in which an electron donor (donor) is added to an organic compound having an excellent electron-transport property. Alternatively, both of these structures may be stacked.

In the case of the structure in which an electron acceptor is added to an organic compound having an excellent hole-transport property, as the organic compound having an excellent hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB) can be used. The substances given here are mainly ones having a hole mobility of $10^{-6}$ $cm^2/Vs$ or higher. However, any substance other than the above substances may be used as long the hole-transport property is higher than the electron-transport property.

Examples of the electron acceptor include a halogen compound such as 7,7,8,8-tetracyano-2,3,5,6-tetrafluoroquinodimethane (abbreviation: F4TCNQ) or chloranil; and a cyano compound such as pyrazino[2,3-f][1,10]phenanthroline-2,3-dicarbonitrile (abbreviation: PPDN) or dipyrazino[2,3-f:2',3'-h]quinoxaline-2,3,6,7,10,11-hexacarbonitrile (abbreviation: HAT-CN). Examples of the electron acceptor also include a transition metal oxide, and an oxide of metals that belong to Group 4 to Group 8 of the periodic table can be used. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable because it is stable in the air, has a low hygroscopic property, and is easily handled.

In the case of the structure in which an electron donor is added to an organic compound having an excellent electron-transport property, as the organic compound having an excellent electron-transport property, for example, a metal complex having a quinoline skeleton or a benzoquinoline skeleton, such as Alq, $Almq_3$, $BeBq_2$, or BAlq, can be used. A metal complex having an oxazole-based ligand or a thiazole-based ligand, such as $Zn(BOX)_2$ or $Zn(BTZ)_2$, or the like can also be used. Other than metal complexes, PBD, OXD-7, TAZ, BPhen, BCP, or the like can be used. The substances given here are mainly ones having an electron mobility of $10^{-6}$ $cm^2/Vs$ or higher. Note that substances other than the above substances may be used as long as the electron-transport property is higher than the hole-transport property.

Further, as the electron donor, an alkali metal, an alkaline earth metal, a rare earth metal, a metal belonging to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be also used as the electron donor.

Note that formation of the charge-generation layer 305 with use of any of the above materials can suppress an increase in drive voltage caused by the stack of the EL layers.

Figure 4B:
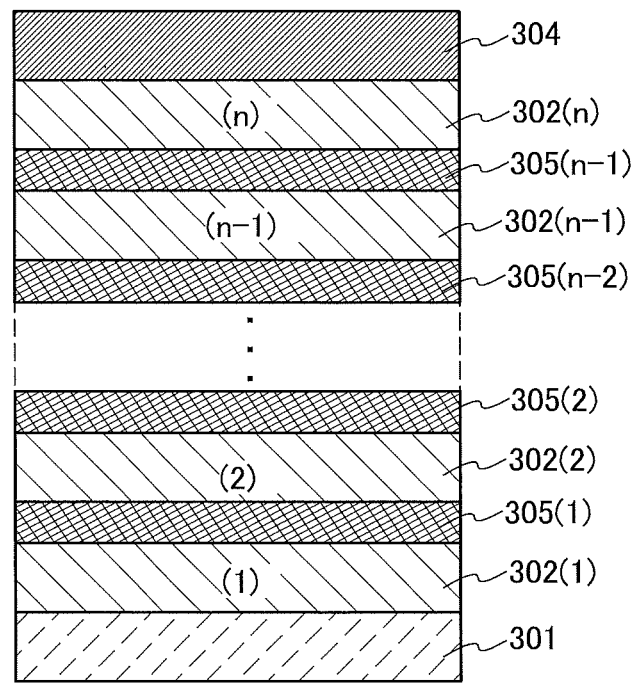

Although the light-emitting element having two EL layers is described in this embodiment, the present invention can be similarly applied to a light-emitting element in which n EL layers are stacked as illustrated in FIG. 4B. In the case where a plurality of EL layers is provided between a pair of electrodes as in the light-emitting element of this embodiment, by providing the charge-generation layer between the EL layers, the light-emitting element can emit light in a high luminance region while the current density is kept low. Since the current density can be kept low, the element can have a long lifetime. When the light-emitting element is applied to illumination, voltage drop due to resistance of an electrode material can be reduced, thereby achieving homogeneous light emission in a large area. In addition, a low-power-consumption light-emitting device which can be driven at low voltage can be achieved.

By making emission colors of the EL layers different, light of a desired color can be obtained from the light-emitting element as a whole. For example, the emission colors of first and second EL layers are complementary in a light-emitting element having the two EL layers, whereby the light-emitting element can emit white light as a whole. Note that the term "complementary" means color relationship in which an achromatic color is obtained when colors are mixed. In other words, emission of white light can be obtained by mixture of light emitted from substances whose emission colors are complementary colors.

Further, the same applies to a light-emitting element having three EL layers. For example, the light-emitting element as a whole can emit white light when the emission color of the first EL layer is red, the emission color of the second EL layer is green, and the emission color of the third EL layer is blue.

As well as the structure described in this embodiment in which the EL layers are stacked with the charge generation layer provided therebetween, the light-emitting element may have a micro optical resonator (microcavity) structure which utilizes a light resonant effect by adjusting a distance between the electrodes (the first electrode 301 and the second electrode 304) to a desired value.

Note that the structure described in this embodiment can be used in combination with any of the structures described in the other embodiments, as appropriate.

(Embodiment 4)

In this embodiment, a light-emitting device including a light-emitting element of one embodiment of the present invention is described.

Note that any of the light-emitting elements described in the other embodiments can be used as the light-emitting element. Further, although either a passive matrix light-emitting device or an active matrix light-emitting device may be used as the light-emitting device, an active matrix light-emitting device is described in this embodiment with reference to FIGS. 5A and 5B.

Figure 5A:
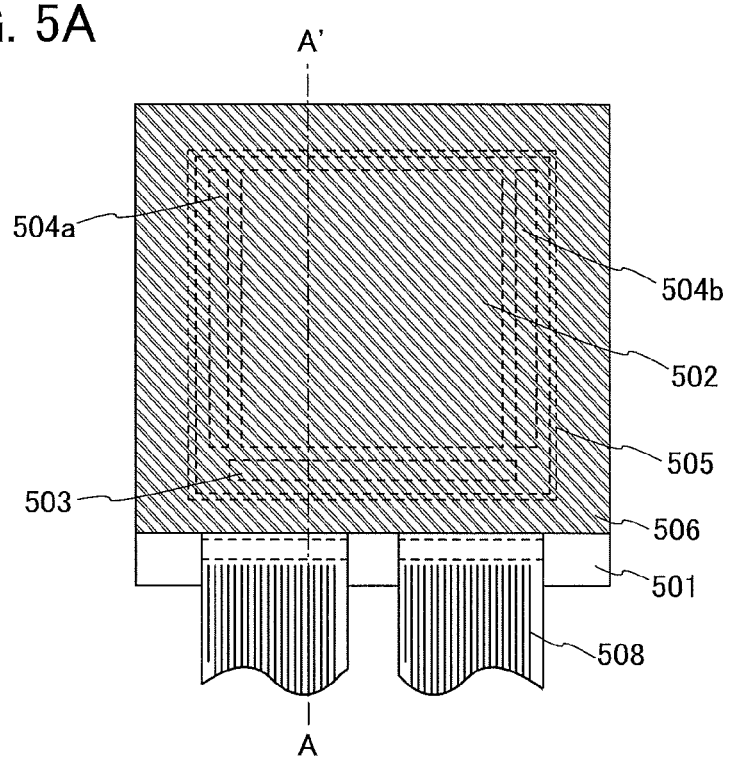
FIGS. 5A and 5B illustrate a light-emitting device.
Figure 5B:
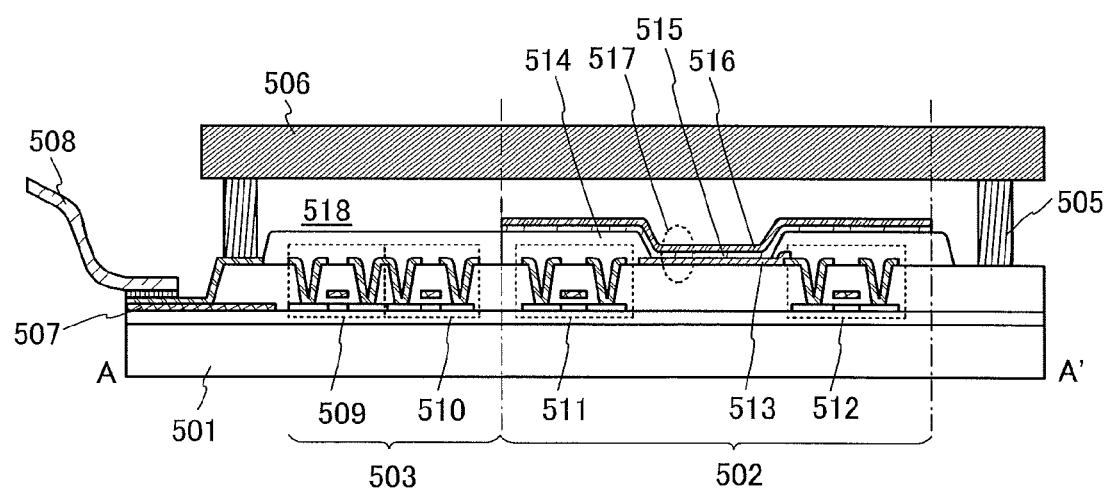

Note that FIG. 5A is a top view illustrating a light-emitting device and FIG. 5B is a cross-sectional view taken along the chain line A-A' in FIG. 5A. The active matrix light-emitting device of this embodiment includes a pixel portion 502 provided over an element substrate 501, a driver circuit portion (a source line driver circuit) 503, and driver circuit portions (gate line driver circuits) 504a and 504b. The pixel portion 502, the driver circuit portion 503, and the driver circuit portions 504a and 504b are sealed between the element substrate 501 and the sealing substrate 506 with a sealant 505.

A lead wiring 507 is provided over the element substrate 501. The lead wiring 507 is provided for connecting an external input terminal through which a signal (e.g., a video signal, a clock signal, a start signal, and a reset signal) or a potential from the outside is transmitted to the driver circuit portion 503 and the driver circuit portions 504a and 504b. Here is shown an example in which a flexible printed circuit (FPC) 508 is provided as the external input terminal. Although the FPC is illustrated alone, this FPC may be provided with a printed wiring board (PWB). The light-emitting device in the present specification includes, in its category, not only the light-emitting device itself but also the light-emitting device provided with the FPC or the PWB.

Next, a cross-sectional structure is described with reference to FIG. 5B. The driver circuit portion and the pixel portion are formed over the element substrate 501; here are illustrated the driver circuit portion 503 which is the source line driver circuit and the pixel portion 502.

The driver circuit portion 503 is an example where a CMOS circuit is formed, which is a combination of an n-channel FET 509 and a p-channel FET 510. Note that a circuit included in the driver circuit portion may be formed using various CMOS circuits, PMOS circuits, or NMOS circuits. Although this embodiment shows a driver integrated type in which the driver circuit is formed over the substrate, the driver circuit is not necessarily formed over the substrate, and may be formed outside the substrate.

The pixel portion 502 is formed of a plurality of pixels each of which includes a switching FET 511, a current control FET 512, and a first electrode (anode) 513 which is electrically connected to a wiring (a source electrode or a drain electrode) of the current control FET 512. Note that an insulator 514 is formed to cover end portions of the first electrode (anode) 513. In this embodiment, the insulator 514 is formed using a positive photosensitive acrylic resin.

The insulator 514 preferably has a curved surface with curvature at an upper end portion or a lower end portion thereof in order to obtain favorable coverage by a film which is to be stacked over the insulator 514. For example, in the case of using a positive photosensitive acrylic resin as a material of the insulator 514, the insulator 514 preferably has a curved surface with a curvature radius (0.2 μm to 3 μm) at the upper end portion. Note that the insulator 514 can be formed using either a negative photosensitive resin or a positive photosensitive resin. The material of the insulator 514 is not limited to an organic compound, and an inorganic compound such as silicon oxide or silicon oxynitride can also be used.

An EL layer 515 and a second electrode (cathode) 516 are stacked over the first electrode (anode) 513, so that a light-emitting element 517 is formed. Note that the EL layer 515 includes at least the light-emitting layer described in Embodiment 1. In the EL layer 515, a hole-injection layer, a hole-transport layer, an electron-transport layer, an electron-injection layer, a charge-generation layer, and the like can be provided as appropriate in addition to the light-emitting layer.

For the first electrode (anode) 513, the EL layer 515, and the second electrode (cathode) 516, the materials described in Embodiment 2 can be used. Although not illustrated, the second electrode (cathode) 516 is electrically connected to the FPC 508 which is an external input terminal.

Although the cross-sectional view of FIG. 5B illustrates only one light-emitting element 517, a plurality of light-emitting elements is arranged in a matrix in the pixel portion 502. Light-emitting elements which provide three kinds of light emission (R, Gs and B) are selectively formed in the pixel portion 502, whereby a light-emitting device capable of full color display can be fabricated. Alternatively, a light-emitting device which is capable of full color display may be fabricated by a combination with color filters.

Further, the sealing substrate 506 is attached to the element substrate 501 with the sealant 505, whereby the light-emitting element 517 is provided in a space 518 surrounded by the element substrate 501, the sealing substrate 506, and the sealant 505. The space 518 may be filled with an inert gas (such as nitrogen or argon), or the sealant 505.

An epoxy-based resin or a glass frit is preferably used for the sealant 505. It is preferable that such a material allow permeation of moisture or oxygen as little as possible. As the sealing substrate 506, a glass substrate, a quartz substrate, or a plastic substrate formed of fiberglass reinforced plastic (FRP), polyvinyl fluoride (PVF), polyester, acrylic, or the like can be used. In the case where glass frit is used as the sealant, the element substrate 501 and the sealing substrate 506 are preferably glass substrates.

As described above, an active matrix light-emitting device can be obtained.

Note that the structure described in this embodiment can be used in combination with any of the structures described in the other embodiments, as appropriate.

(Embodiment 5)

In this embodiment, examples of a variety of electronic devices which are completed using a light-emitting device are described with reference to FIGS. 6A to 6D and FIGS. 7A to 7C. The light-emitting device is fabricated using the light-emitting element of one embodiment of the present invention.

Examples of the electronic devices to which the light-emitting device is applied include television devices (also referred to as TV or television receivers), monitors for computers and the like, digital cameras, digital video cameras, digital photo frames, mobile phones (also referred to as cellular phones or mobile phone devices), portable game machines, portable information terminals, audio playback devices, and large-sized game machines such as pin-ball machines. Specific examples of the electronic devices are illustrated in FIGS. 6A to 6D.

Figure 6A:
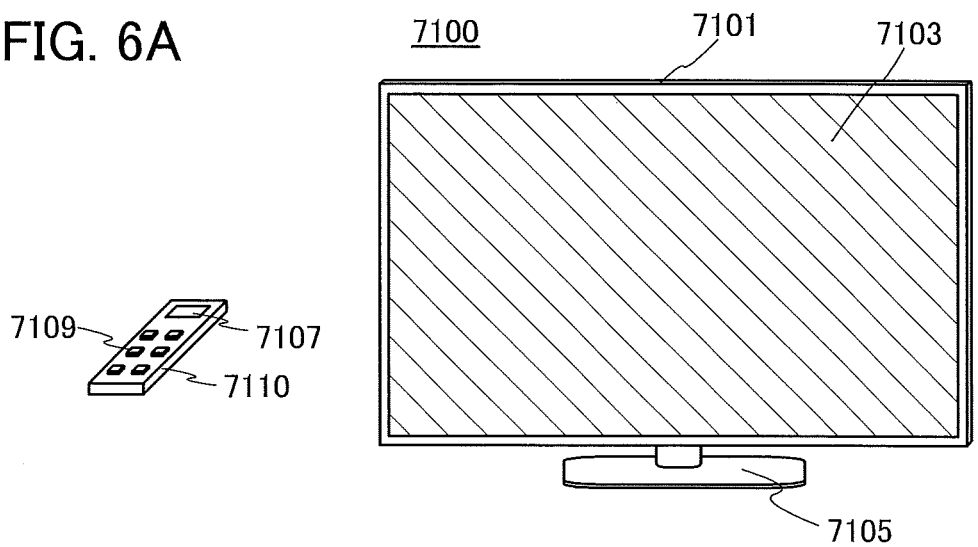
FIGS. 6A to 6D illustrate electronic devices.

FIG. 6A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 6B:
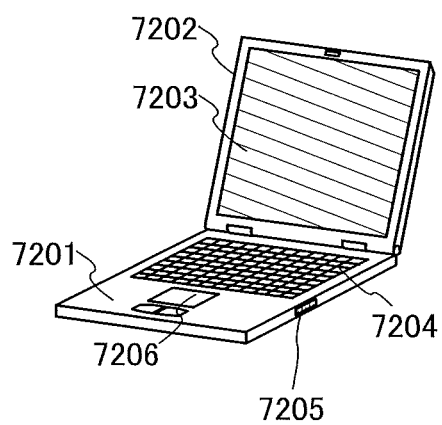

FIG. 6B illustrates a computer including a main body 7201, a housing 7202, a display portion 7203, a keyboard 7204, an external connecting port 7205, a pointing device 7206, and the like. This computer is manufactured by using the light-emitting device of one embodiment of the present invention for the display portion 7203.

Figure 6C:
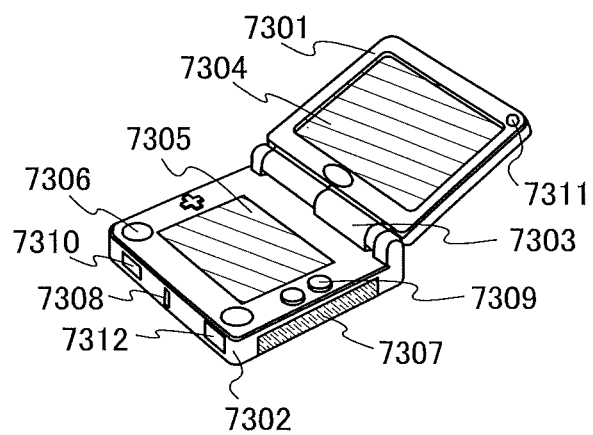

FIG. 6C illustrates a portable game machine including two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 6C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. It is needless to say that the structure of the portable game machine is not limited to the above as long as a light-emitting device is used for at least either the display portion 7304 or the display portion 7305, or both, and may include other accessories as appropriate. The portable game machine illustrated in FIG. 6C has a function of reading out a program or data stored in a storage medium to display it on the display portion, and a function of sharing information with another portable game machine by wireless communication. The portable game machine illustrated in FIG. 6C can have a variety of functions without limitation to the above.

Figure 6D:
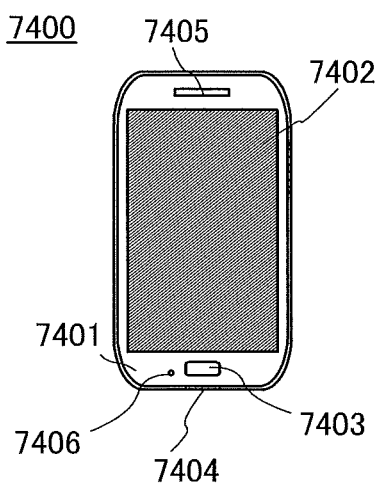

FIG. 6D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 6D is touched with a finger or the like, data can be input into the mobile phone 7400. Further, operations such as making a call and composing an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 7A:
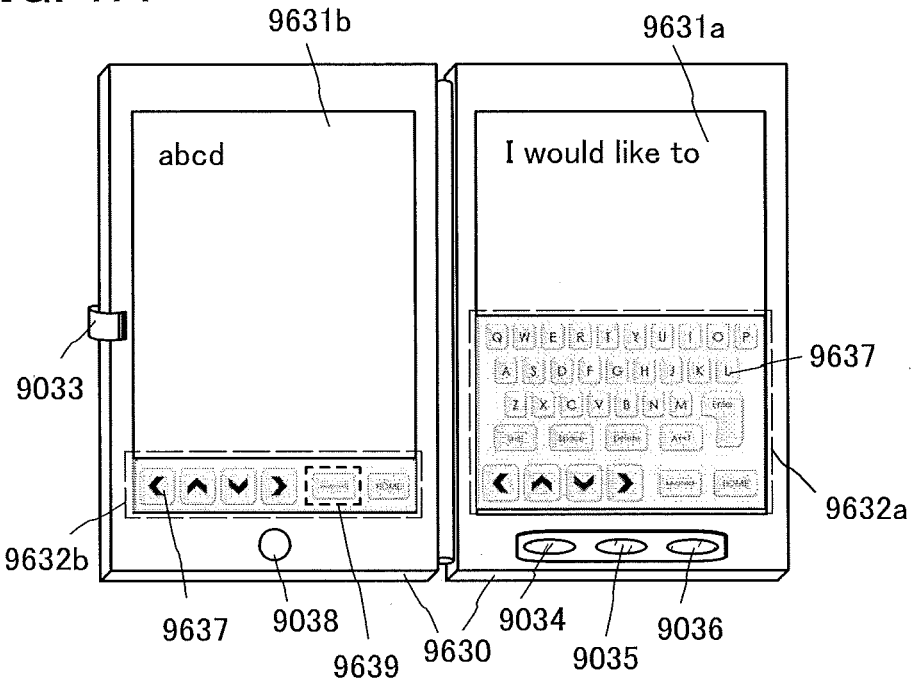
FIGS. 7A to 7C illustrate an electronic device.
Figure 7B:
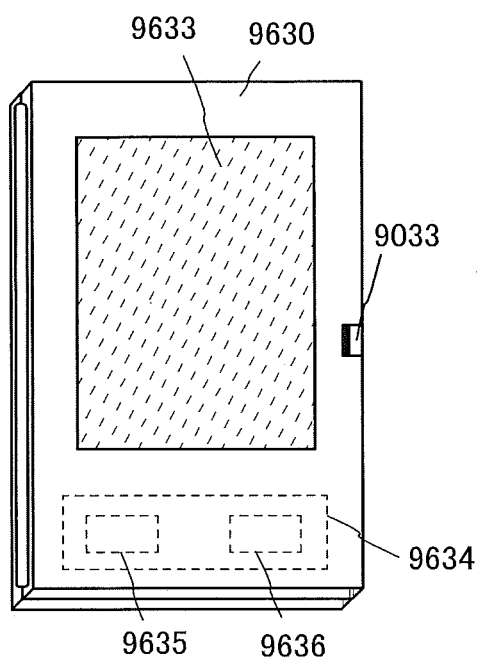

FIGS. 7A and 7B illustrate a foldable tablet terminal. In FIG. 7A, the tablet terminal is opened. The tablet terminal includes a housing 9630, a display portion 9631a, a display portion 9631b, a display mode switch 9034, a power switch 9035, a power saver switch 9036, a clasp 9033, and an operation switch 9038. The tablet terminal is manufactured using the light-emitting device for one or both of the display portions 9631a and 9631b.

Part of the display portion 9631 1a can be a touch panel region 9632a, and data can be input by touching operation keys 9637 that are displayed. Note that FIG. 7A shows, as an example, that half of the area of the display portion 9631a has only a display function and the other half of the area has a touch panel function. However, the structure of the display portion 963 1a is not limited to this, and all the area of the display portion 9631a may have a touch panel function. For example, all the area of the display portion 9631a can display keyboard buttons and serve as a touch panel while the display portion 9631b can be used as a display screen.

Like the display portion 963 1a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Furthermore, touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although FIG. 7A shows the example where the display area of the display portion 963 1a is the same as that of the display portion 9631b, one embodiment of the present invention is not limited to this example. They may differ in size and/or image quality. For example, one of them may be a display panel that can display higher-definition images than the other.

FIG. 7B illustrates the tablet terminal which is closed. The tablet terminal includes the housing 9630, a solar battery 9633, a charge/discharge control circuit 9634, a battery 9635, and a DC to DC converter 9636. As an example, FIG. 7B illustrates the charge/discharge control circuit 9634 including the battery 9635 and the DC to DC converter 9636.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 7A and 7B can also have a function of displaying various kinds of data, such as a calendar, a date, or the time, on the display portion as a still image, a moving image, and a text image, a function of displaying, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that a structure in which the solar battery 9633 is provided is preferable because the battery 9635 which supplies electric power to the display portion 9631a and/or the display portion 9631b can be charged. When a lithium ion battery is used as the battery 9635, there is an advantage of downsizing or the like.

Figure 7C:
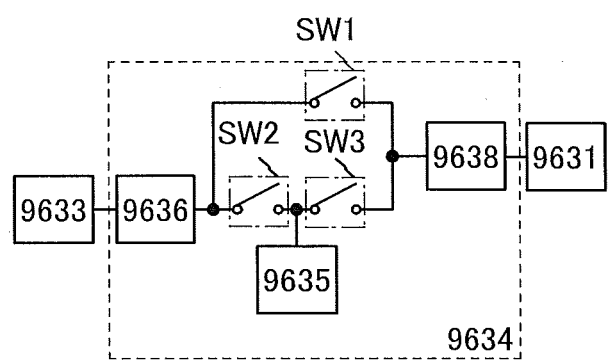

The structure and operation of the charge/discharge control circuit 9634 illustrated in FIG. 7B are described with reference to a block diagram in FIG. 7C. FIG. 7C illustrates the solar battery 9633, the battery 9635, the DC to DC converter 9636, a converter 9638, switches SW1 to SW3, and the display portion 9631. The battery 9635, the DC to DC converter 9636, the converter 9638, and the switches SW1 to SW3 correspond to those in the charge/discharge control circuit 9634 illustrated in FIG. 7B.

An example of the operation performed when power is generated by the solar battery 9633 using external light is described. The voltage of power generated by the solar battery 9633 is raised or lowered by the DC to DC converter 9636 so as to be a voltage for charging the battery 9635. Then, when power from the solar battery 9633 is used for the operation of the display portion 9631, the switch SW1 is turned on and the voltage of the power is raised or lowered by the converter 9638 so as to be a voltage needed for the display portion 9631. When images are not displayed on the display portion 9631, the switch SW1 is turned off and the switch SW2 is turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

It is needless to say that an embodiment of the present invention is not limited to the electronic device illustrated in FIGS. 7A to 7C as long as the display portion described in the above embodiment is included.

As described above, the electronic devices can be obtained by application of the light-emitting device of one embodiment of the present invention. The light-emitting device has an extremely wide application range, and can be applied to electronic devices in a variety of fields.

Note that the structure described in this embodiment can be used in combination with any of the structures described in the other embodiments, as appropriate.

(Embodiment 6)

In this embodiment, examples of lighting devices which are completed using a light-emitting device are described with reference to FIG. 8. The light-emitting device is fabricated using a light-emitting element of one embodiment of the present invention.

Figure 8:
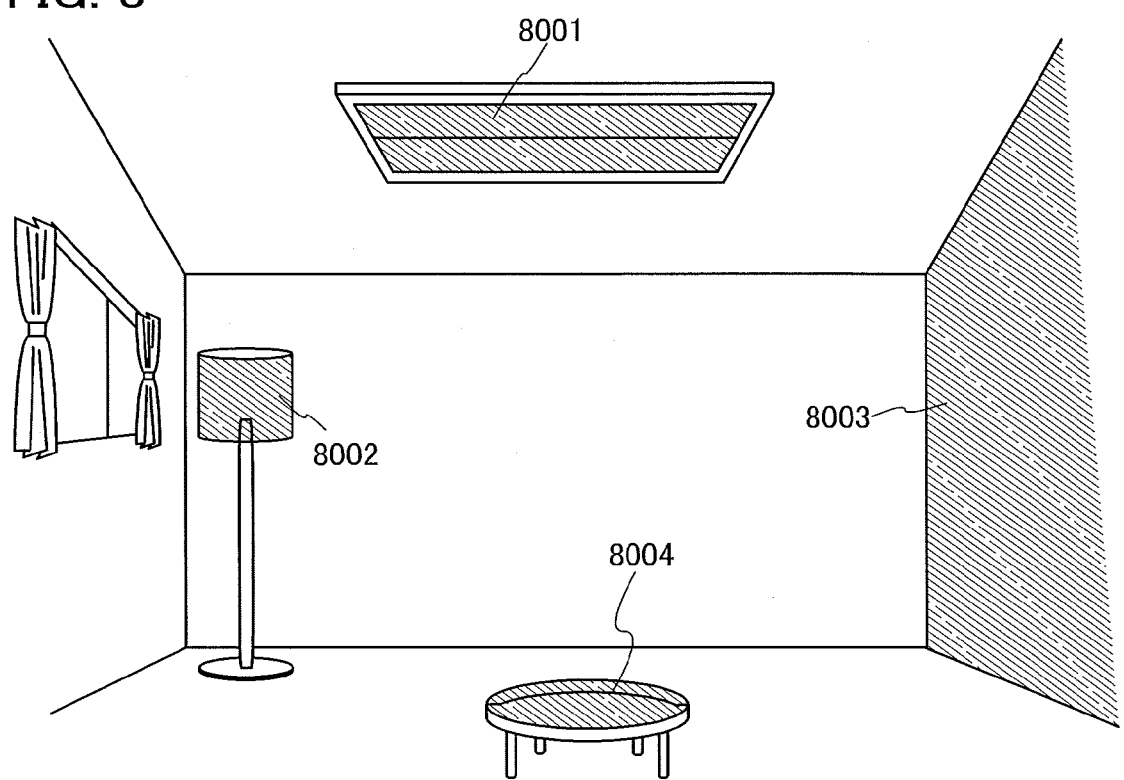
FIG. 8 illustrates lighting devices.

FIG. 8 illustrates an example in which the light-emitting device is used as an indoor lighting device 8001. Since the light-emitting device can have a larger area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, when the light-emitting device is used at a surface of a table, a lighting device 8004 which has a function as a table can be obtained. When the light-emitting device is used as part of other furniture, a lighting device which has a function as the furniture can be obtained.

As described above, a variety of lighting devices to which the light-emitting device is applied can be obtained. Note that such lighting devices are also embodiments of the present invention.

Note that the structure described in this embodiment can be used in combination with any of the structures described in the other embodiments, as appropriate.

(Embodiment 7)

In this embodiment, a light-emitting device manufactured using the light-emitting element of one embodiment of the present invention is described with reference to FIGS. 18A and 18B.

Figure 18A:
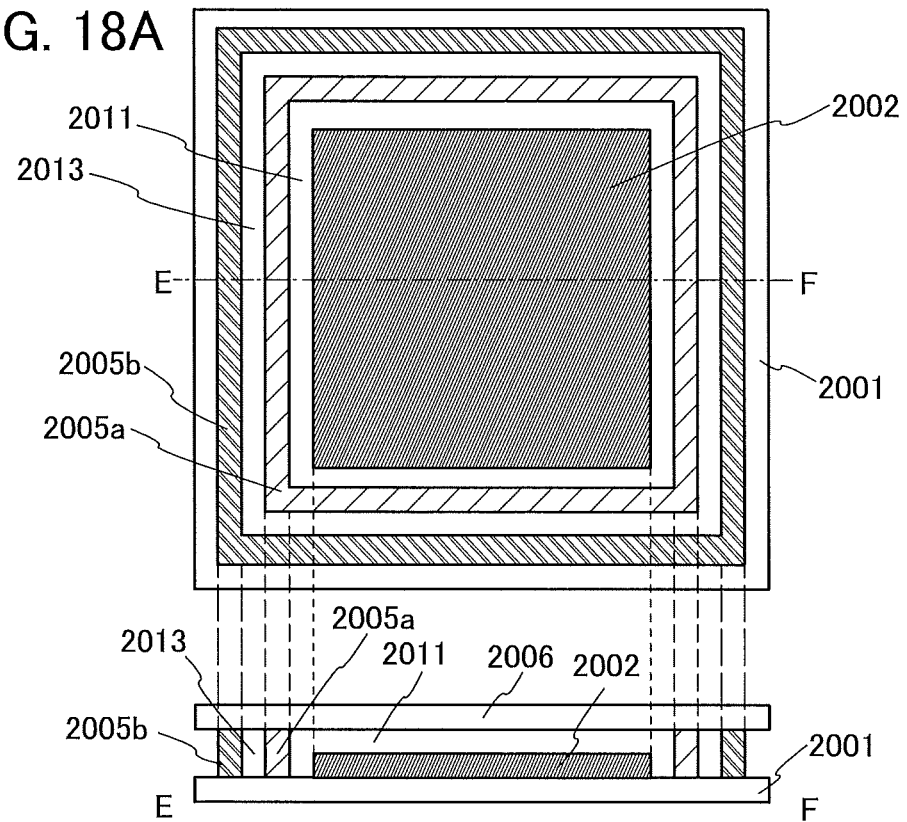
FIGS. 18A and 18B illustrate a light-emitting device of one embodiment of the present invention.

In FIG. 18A, a plan view of a light-emitting device described in this embodiment and a cross-sectional view taken along the dashed-dotted line E-F in the plan view are illustrated.

The light-emitting device illustrated in FIG. 18A includes a light-emitting portion 2002 including a light-emitting element over a first substrate 2001. The light-emitting device has a structure in which a first sealant 2005*a* is provided so as to surround the light-emitting portion 2002 and a second sealant 2005*b* is provided so as to surround the first sealant 2005*a* (i.e., a double sealing structure).

Thus, the light-emitting portion 2002 is positioned in a space surrounded by the first substrate 2001, the second substrate 2006, and the first sealant 2005*a*.

Note that in this specification, the first sealant 2005*a* and the second sealant 2005*b* are not necessarily in contact with the first substrate 2001 and the second substrate 2006. For example, the first sealant 2005*a* may be in contact with an insulating film or a conductive film formed over the first substrate 2001.

In the above structure, the first sealant 2005*a* is a resin layer containing a desiccant and the second sealant 2005*b* is a glass layer, whereby an effect of suppressing entry of impurities such as moisture and oxygen from the outside (hereinafter, referred to as a sealing property) can be increased.

The first sealant 2005*a* is the resin layer as described above, whereby the glass layer that is the second sealant 2005*b* can be prevented from having breaking or cracking (hereinafter, collectively referred to as a crack). Further, in the case where the sealing property of the second sealant 2005*b* is not sufficient, even when impurities such as moisture and oxygen enter a first space 2013, entry of the impurities such as moisture and oxygen into a second space 2011 can be suppressed owing to a high sealing property of the first sealant 2005*a*. Thus, deterioration of an organic compound, a metal material, and the like contained in the light-emitting element because of entry of impurities such as moisture and oxygen into the light-emitting portion 2002 can be suppressed.

Figure 18B:
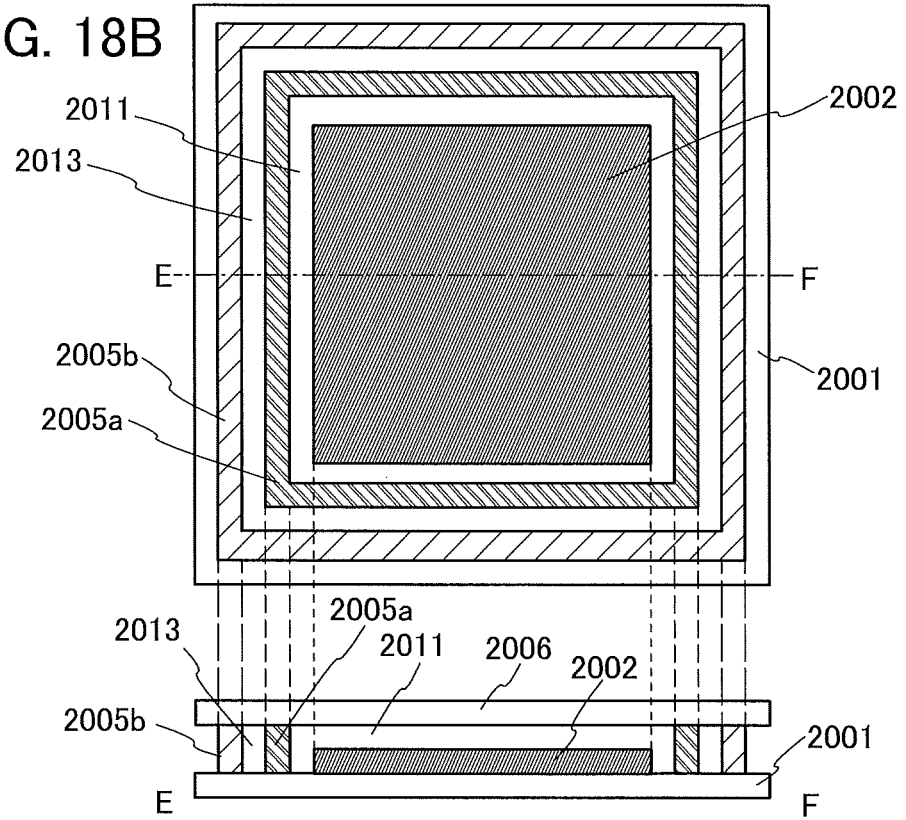

In addition, the structure illustrated in FIG. 18B can be employed in which the first sealant 2005*a* is a glass layer and the second sealant 2005*b* is a resin layer containing a desiccant.

In each of the light-emitting devices described in this embodiment, distortion due to external force or the like increases toward the outer portion of the light-emitting device. In view of the above, the first sealant 2005*a* which has relatively small distortion due to external force or the like is a glass layer and the second sealant 2005*b* is a resin layer which has excellent impact resistance and excellent heat resistance and is not easily broken by deformation due to external force or the like, whereby entry of moisture and oxygen into the first space 2013 can be suppressed.

In addition to the above structure, a material serving as a desiccant may be contained in each of the first space 2013 and the second space 2011.

In the case where the first sealant 2005*a* or the second sealant 2005*b* is a glass layer, for example, a glass frit or a glass ribbon can be used. Note that at least a glass material is contained in a glass frit or a glass ribbon.

The glass frit contains a glass material as a frit material. The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

In the case where a glass layer is formed using any of the above glass frits, for example, a frit paste is applied to a substrate and is subjected to heat treatment, laser light irradiation, or the like. The frit paste contains the frit material and a resin (also referred to as a binder) diluted by an organic solvent. A known material and structure can be used for the frit paste. An absorber which absorbs light having a wavelength of laser light may be added to the frit material. For example, an Nd:YAG laser or a semiconductor laser is preferably used as the laser. The shape of laser light may be circular or quadrangular.

Note that the thermal expansion coefficient of the glass layer to be formed is preferably close to that of the substrate. The closer the thermal expansion coefficients are, the more generation of a crack in the glass layer or the substrate due to thermal stress can be suppressed.

Although any of known materials, for example, photocurable resins such as an ultraviolet curable resin and thermosetting resins can be used in the case where the first sealant 2005*a* or the second sealant 2005*b* is a resin layer, it is particularly preferable to use a material which does not transmit moisture or oxygen. In particular, a photocurable resin is preferably used. The light-emitting element contains a material having low heat resistance in some cases. A photocurable resin, which is cured by light irradiation, is preferably used, in which case change in film quality and deterioration of an organic compound itself caused by heating of the light-emitting element can be suppressed. Furthermore, any of the organic compounds that can be used for the light-emitting element of one embodiment of the present invention may be used.

As the desiccant contained in the resin layer, the first space 2013, or the second space 2011, a known material can be used. As the desiccant, a substance which adsorbs moisture and the like by chemical adsorption or a substance which adsorbs moisture and the like by physical adsorption can be used. Examples thereof are alkali metal oxides, alkaline earth metal oxides (e.g., calcium oxide and barium oxide), sulfates, metal halides, perchlorates, zeolite, and silica gel.

One or both of the first space 2013 and the second space 2011 may be filled with, for example, an inert gas such as a rare gas or a nitrogen gas or may be filled with an organic resin. Note that these spaces are each in an atmospheric pressure state or a reduced pressure state.

As described above, the light-emitting device described in this embodiment has a double sealing structure, in which one of the first sealant 2005a and the second sealant 2005b is the glass layer having excellent productivity and an excellent sealing property, and the other is the resin layer which is hardly broken caused by external force or the like, and can contain the desiccant inside, so that a sealing property of suppressing entry of impurities such as moisture and oxygen from the outside can be improved.

Thus, the use of the structure described in this embodiment can provide a light-emitting device in which deterioration of a light-emitting element due to impurities such as moisture and oxygen is suppressed.

Note that the structure described in this embodiment can be used in combination with any of the structures described in the other embodiments and examples as appropriate.

(Embodiment 8)

In this embodiment, a light-emitting device in which the light-emitting element of one embodiment of the present invention is used is described with reference to FIGS. 19A and 19B.

FIGS. 19A and 19B are each an example of a cross-sectional view of a light-emitting device including a plurality of light-emitting elements. A light-emitting device 3000 illustrated in FIG. 19A includes light-emitting elements 3020a, 3020b, and 3020c.

The light-emitting device 3000 includes island-shaped lower electrodes 3003a, 3003b, and 3003c over a substrate 3001. The lower electrodes 3003a, 3003b, and 3003c can function as anodes of the respective light-emitting elements. Reflective electrodes may be provided under the lower electrodes 3003a, 3003b, and 3003c. Transparent conductive layers 3005a, 3005b, and 3005c may be provided over the lower electrodes 3003a, 3003b, and 3003c, respectively. The transparent conductive layers 3005a, 3005b, and 3005c preferably have different thicknesses depending on emission colors of the elements.

The light-emitting device 3000 includes partitions 3007a, 3007b, 3007c, and 3007d. Specifically, the partition 3007a covers one edge portion of the lower electrode 3003a and one edge portion of the transparent conductive layer 3005a; the partition 3007b covers the other edge portion of the lower electrode 3003a and the other edge portion of the transparent conductive layer 3005a and also covers one edge portion of the lower electrode 3003b and one edge portion of the transparent conductive layer 3005b; the partition 3007c covers the other edge portion of the lower electrode 3003b and the other edge portion of the transparent conductive layer 3005b and also covers one edge portion of the lower electrode 3003c and one edge portion of the transparent conductive layer 3005c; the partition 3007d covers the other edge portion of the lower electrode 3003c and the other edge portion of the transparent conductive layer 3005c.

The light-emitting device 3000 includes a hole-injection layer 3009 over the lower electrodes 3003a, 3003b, and 3003c and the partitions 3007a, 3007b, 3007c, and 3007d.

The light-emitting device 3000 includes a hole-transport layer 3011 over the hole-injection layer 3009. The light-emitting device 3000 also includes light-emitting layers 3013a, 3013b, and 3013c over the hole-transport layer 3011. The light-emitting device 3000 also includes an electron-transport layer 3015 over the light-emitting layers 3013a, 3013b, and 3013c.

Further, the light-emitting device 3000 includes an electron-injection layer 3017 over the electron-transport layer 3015. The light-emitting device 3000 also includes an upper electrode 3019 over the electron-injection layer 3017. The upper electrode 3019 can function as cathodes of the light-emitting elements.

Note that although an example in which the lower electrodes 3003a, 3003b, and 3003c function as the anodes of the light-emitting elements and the upper electrode 3019 functions as the cathodes of the light-emitting elements is described with reference to FIG. 19A, the stacking order of the anode and the cathode may be switched. In this case, the stacking order of the electron-injection layer, the electron-transport layer, the hole-transport layer, and the hole-injection layer may be changed as appropriate.

The light-emitting element of one embodiment of the present invention can be applied to the light-emitting layers 3013a, 3013b, and 3013c. The light-emitting element can have low driving voltage, high current efficiency, or a long lifetime; thus, the light-emitting device 3000 can have low power consumption or a long lifetime.

A light-emitting device 3100 illustrated in FIG. 19B includes light-emitting elements 3120a, 3120b, and 3120c. The light-emitting elements 3120a, 3120b, and 3120c are tandem light-emitting elements in which a plurality of light-emitting layers is provided between lower electrodes 3103a, 3103b, and 3103c and an upper electrode 3119.

The light-emitting device 3100 includes the island-shaped lower electrodes 3103a, 3103b, and 3103c over a substrate 3101. The lower electrodes 3103a, 3103b, and 3103c function as anodes of the light-emitting elements. Note that reflective electrodes may be provided under the lower electrodes 3103a, 3103b, and 3103c. Transparent conductive layers 3105a and 3105b may be provided over the lower electrodes 3103a and 3103b. The transparent conductive layers 3105a and 3105b preferably have different thicknesses depending on emission colors of the elements. Although not illustrated, a transparent conductive layer may also be provided over the lower electrode 3103c.

The light-emitting device 3100 includes partitions 3107a, 3107b, 3107c, and 3107d. Specifically, the partition 3107a covers one edge portion of the lower electrode 3103a and one edge portion of the transparent conductive layer 3105a; the partition 3107b covers the other edge portion of the lower electrode 3103a and the other edge portion of the transparent conductive layer 3105a and also covers one edge portion of the lower electrode 3103b and one edge portion of the transparent conductive layer 3105b; the partition 3107c covers the other edge portion of the lower electrode 3103b and the other edge portion of the transparent conductive layer 3105b and also covers one edge portion of the lower electrode 3103c and one edge portion of the transparent conductive layer 3105c; the partition 3107d covers the other edge portion of the lower electrode 3103c and the other edge portion of the transparent conductive layer 3105c.

The light-emitting device 3100 includes a hole-injection and hole-transport layer 3110 over the lower electrodes 3103a, 3103b, and 3103c and the partitions 3107a, 3107b, 3107c, and 3107d.

The light-emitting device 3100 includes a first light-emitting layer 3112 over the hole-injection and hole-transport layer 3110. The light-emitting device 3100 also includes a second light-emitting layer 3116 over the first light-emitting layer 3112 with a charge generation layer 3114 therebetween.

Further, the light-emitting device 3100 includes an electron-transport and electron-injection layer 3118 over the second light-emitting layer 3116. In addition, the light-emitting device 3100 includes the upper electrode 3119 over the electron-transport and electron-injection layer 3118. The upper electrode 3119 can function as cathodes of the light-emitting elements.

Note that although an example in which the lower electrodes 3103a, 3103b, and 3103c function as the anodes of the light-emitting elements and the upper electrode 3119 functions as the cathodes of the light-emitting elements is described with reference to FIG. 19B, the stacking order of the anode and the cathode may be switched. In this case, the stacking order of the electron-injection layer, the electron-transport layer, the hole-transport layer, and the hole-injection layer may be changed as appropriate.

The light-emitting element of one embodiment of the present invention can be applied to the first light-emitting layer 3112 and the second light-emitting layer 3116. The light-emitting element can have low driving voltage, high current efficiency, or a long lifetime; thus, the light-emitting device 3100 can have low power consumption or a long lifetime.

Note that the structure described in this embodiment can be combined with any of the structures described in the other embodiments and the examples as appropriate.

(Embodiment 9)

In this embodiment, a lighting device manufactured using the light-emitting element of one embodiment of the present invention is described with reference to FIGS. 20A to 20E.

Figure 20A:
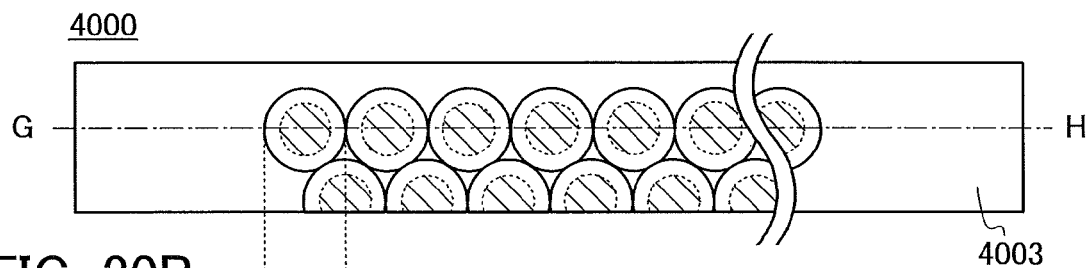
FIGS. 20A to 20E each illustrate a lighting device of one embodiment of the present invention.
Figure 20B:
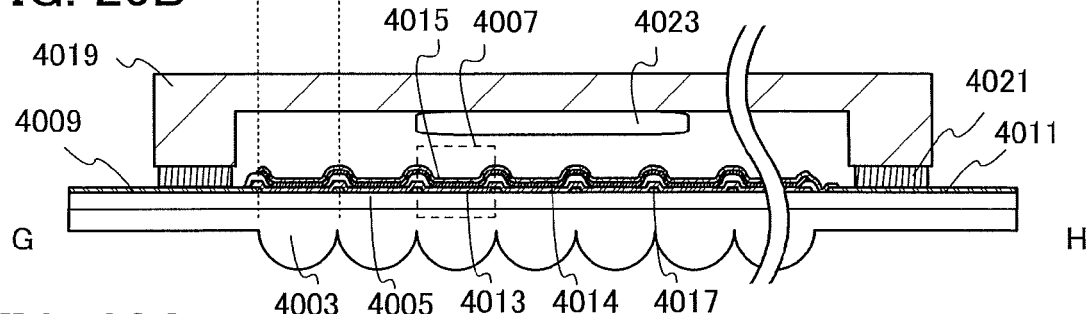
Figure 20C:
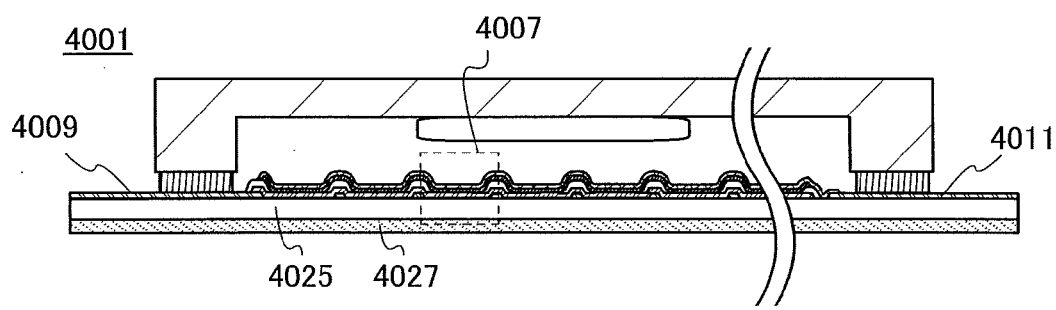

FIGS. 20A to 20E are a plan view and cross-sectional views of lighting devices. FIGS. 20A to 20C are bottom-emission lighting devices in which light is extracted from the substrate side. FIG. 20B is a cross-sectional view taken along the dashed-dotted line G-H in FIG. 20A.

A lighting device 4000 illustrated in FIGS. 20A and 20B includes a light-emitting element 4007 over a substrate 4005. In addition, the lighting device 4000 includes a substrate 4003 with unevenness on the outside of the substrate 4005. The light-emitting element 4007 includes a lower electrode 4013, an EL layer 4014, and an upper electrode 4015.

The lower electrode 4013 is electrically connected to an electrode 4009, and the upper electrode 4015 is electrically connected to an electrode 4011. An auxiliary wiring 4017 electrically connected to the lower electrode 4013 may be provided.

The substrate 4005 and a sealing substrate 4019 are bonded to each other by a sealant 4021. A desiccant 4023 is preferably provided between the sealing substrate 4019 and the light-emitting element 4007.

The substrate 4003 has the unevenness as illustrated in FIG. 20A, whereby the extraction efficiency of light emitted from the light-emitting element 4007 can be increased. Instead of the substrate 4003, a diffusion plate 4027 may be provided on the outside of the substrate 4025 as in a lighting device 4001 illustrated in FIG. 20C.

Figure 20D:
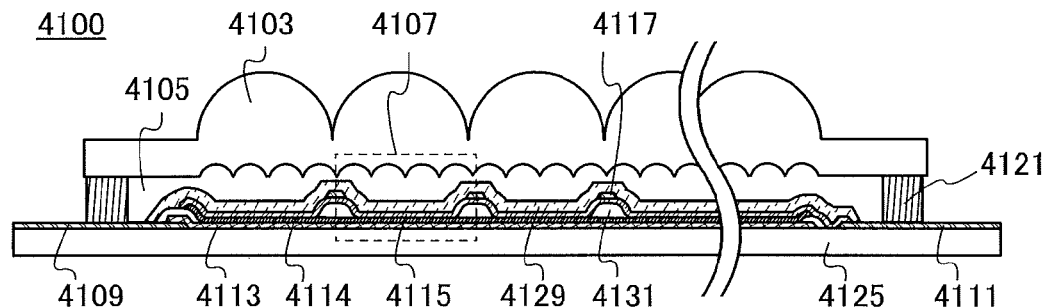
Figure 20E:
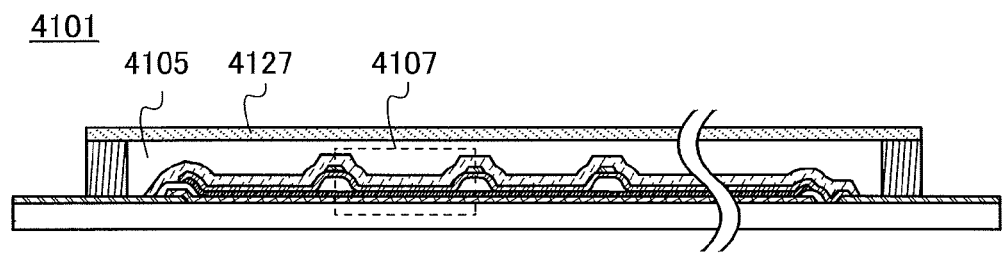

FIGS. 20D and 20E illustrate top-emission lighting devices in which light is extracted from the side opposite to the substrate.

A lighting device 4100 illustrated in FIG. 20D includes a light-emitting element 4107 over a substrate 4125. The light-emitting element 4107 includes a lower electrode 4113, an EL layer 4114, and an upper electrode 4115.

The lower electrode 4113 is electrically connected to an electrode 4109, and the upper electrode 4115 is electrically connected to an electrode 4111. An auxiliary wiring 4117 electrically connected to the upper electrode 4115 may be provided. An insulating layer 4131 may be provided under the auxiliary wiring 4117.

The substrate 4125 and a sealing substrate 4103 with unevenness are bonded to each other by a sealant 4121. A planarization film 4105 and a barrier film 4129 may be provided between the sealing substrate 4103 and the light-emitting element 4107.

The sealing substrate 4103 has the unevenness as illustrated in FIG. 20D, the extraction efficiency of light emitted from the light-emitting element 4107 can be increased. Instead of the sealing substrate 4103, a diffusion plate 4127 may be provided over the light-emitting element 4107 as in a lighting device 4101 illustrated in FIG. 20E.

The light-emitting element of one embodiment of the present invention can be applied to light-emitting layers included in the EL layer 4014 and the EL layer 4114. The light-emitting element can have low driving voltage, high current efficiency, or a long lifetime; thus, the lighting devices 4000, 4001, 4100, and 4101 can have low power consumption or a long lifetime.

Note that the structure described in this embodiment can be combined with any of the structures described in the other embodiments and the examples as appropriate.

(Embodiment 10)

In this embodiment, a touch sensor and a module each of which can be combined with the light-emitting device of one embodiment of the present invention are described with reference to FIGS. 21A and 21B, FIG. 22, FIG. 23, and FIG. 24.

Figure 21A:
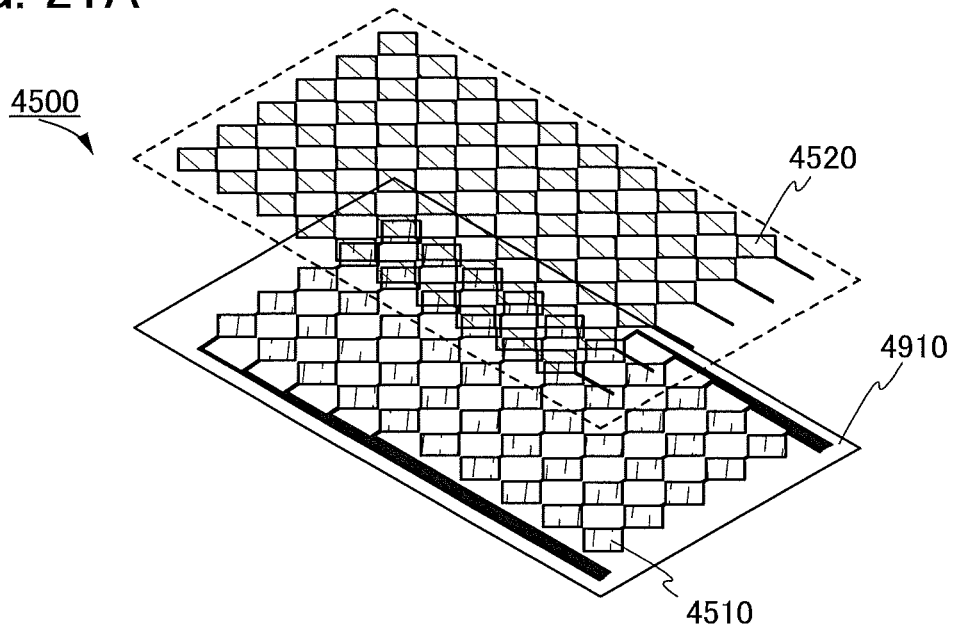
FIGS. 21A and 21B illustrate a touch sensor of one embodiment of the present invention.
Figure 21B:
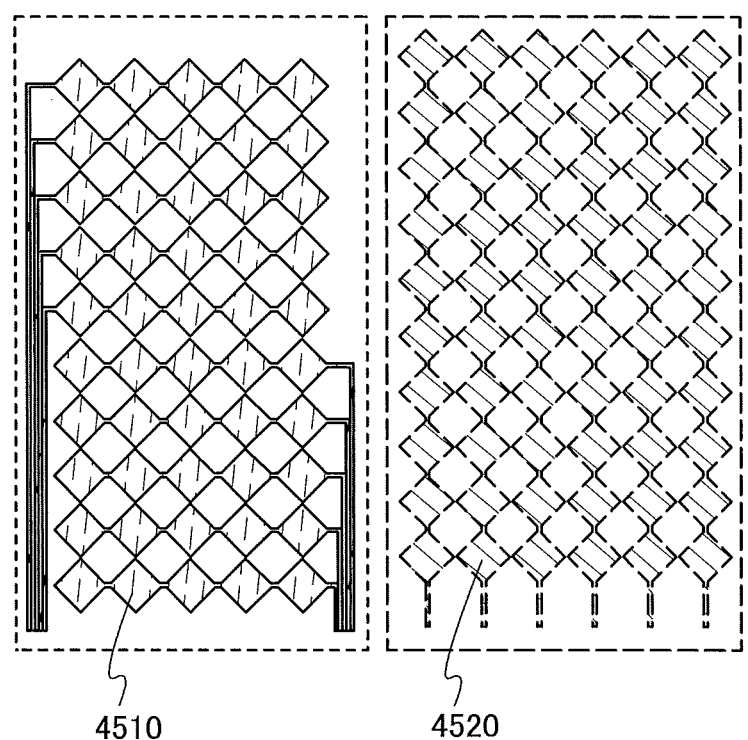

FIG. 21A is an exploded perspective view illustrating a structural example of a touch sensor 4500. FIG. 21B is a plan view illustrating a structural example of the touch sensor 4500.

The touch sensor 4500 illustrated in FIGS. 21A and 21B includes, over a substrate 4910, a plurality of conductive layers 4510 arranged in the X-axis direction and a plurality of conductive layers 4520 arranged in the Y-axis direction which intersect with the X-axis direction. In FIGS. 21A and 21B illustrating the touch sensor 4500, a plane over which the plurality of conductive layers 4510 are formed and a plane over which the plurality of conductive layers 4520 are formed are separately illustrated.

Figure 22:
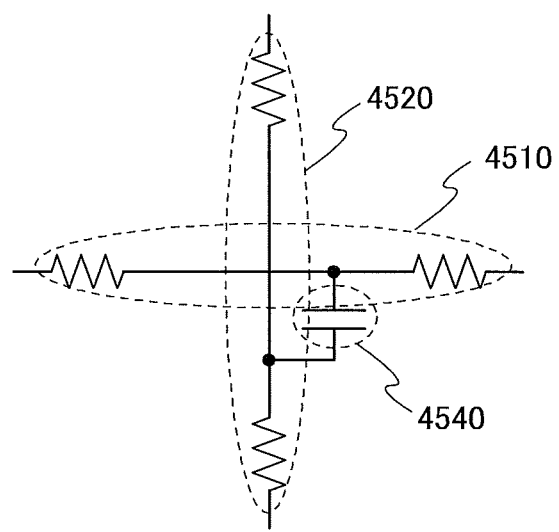
FIG. 22 is a circuit diagram of a touch sensor of one embodiment of the present invention.

FIG. 22 is an equivalent circuit diagram illustrating the portion where the conductive layer 4510 and the conductive layer 4520 of the touch sensor 4500 illustrated in FIGS. 21A and 21B intersect with each other. A capacitor 4540 is formed in the portion where the conductive layer 4510 and the conductive layer 4520 intersect with each other as in FIG. 22.

The conductive layer 4510 and the conductive layer 4520 each have a structure in which a plurality of quadrangular conductive films is connected to one another. The plurality of conductive layers 4510 and the plurality of conductive layers 4520 are provided so that the quadrangular conductive films of the conductive layer 4510 and the quadrangular conductive films of the conductive layer 4520 do not overlap with each other. In the portion where the conductive layer 4510 intersects with the conductive layer 4520, an insulating film is provided between the conductive layer 4510 and the conductive layer 4520 so that the conductive layer 4510 and the conductive layer 4520 are not in contact with each other.

Figure 23:
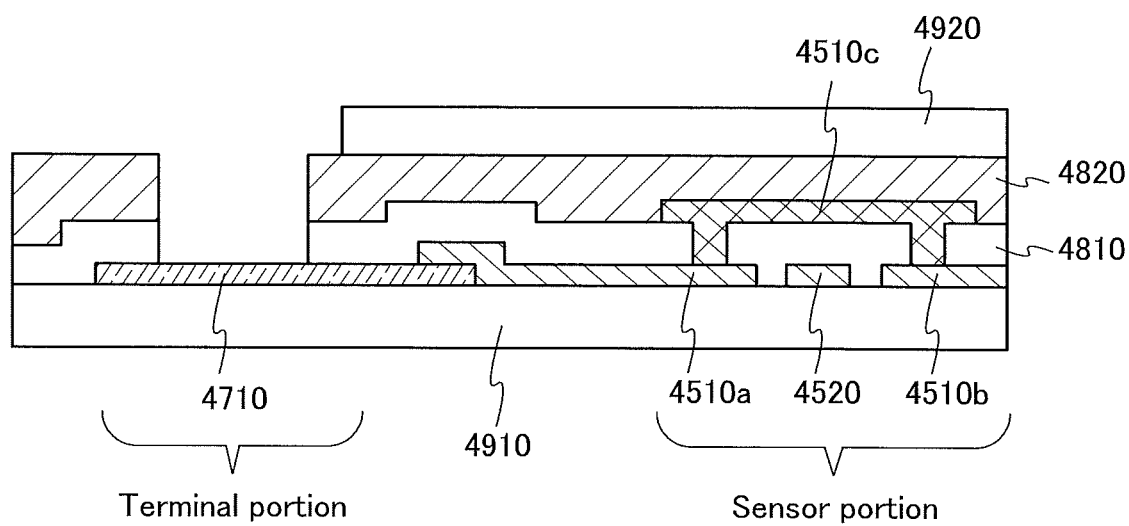
FIG. 23 is a cross-sectional view of a touch sensor of one embodiment of the present invention.

FIG. 23 is a cross-sectional view illustrating an example of a connection between the conductive layers 4510a, 4510b, and 4510c and the conductive layer 4520 in the touch sensor 4500 illustrated in FIGS. 21A and 21B, and is an example of a cross-sectional view illustrating a portion where the conductive layer 4510 (conductive layers 4510a, 4510b, and 4510c) intersect with the conductive layer 4520.

As illustrated in FIG. 23, the conductive layer 4510 includes the conductive layer 4510a and the conductive layer 4510b in the first layer and the conductive layer 4510c in the second layer over an insulating layer 4810. The conductive layer 4510a and the conductive layer 4510b are connected to each other by the conductive layer 4510c. The conductive layer 4520 is formed using the conductive layer in the first layer. The insulating layer 4820 is formed so as to cover the conductive layers 4510 and 4520 and part of a conductive layer 4710. As the insulating layers 4810 and 4820, for example, a silicon oxynitride film may be formed. Note that a base film formed of an insulating film may be formed between a substrate 4910 and the conductive layers 4710, 4510a, 4510b, and 4520. As the base film, for example, a silicon oxynitride film can be formed.

The conductive layers 4510a, 4510b, and 4510c and the conductive layer 4520 are formed using a conductive material having a property of transmitting visible light. Examples of the conductive material having a property of transmitting visible light include indium tin oxide containing silicon oxide, indium tin oxide, zinc oxide, indium zinc oxide, and zinc oxide to which gallium is added.

The conductive layer 4510a is connected to the conductive layer 4710. A terminal for connection to an FPC is formed using the conductive layer 4710. The conductive layer 4520 is connected to the conductive layer 4710 like the conductive layer 4510a. The conductive layer 4710 can be formed of, for example, a tungsten film.

The insulating layer 4820 is formed so as to cover the conductive layers 4510 and 4520 and the conductive layer 4710. An opening is formed in the insulating layers 4810 and 4820 over the conductive layer 4710 so that the conductive layer 4710 is electrically connected to an FPC. A substrate 4920 is attached to and over the insulating layer 4820 using an adhesive, an adhesive film, or the like. The substrate 4910 side is bonded to a color filter substrate of a display panel with an adhesive or an adhesive film, so that a touch panel is completed.

Next, a module for which the light-emitting device of one embodiment of the present invention can be used is described with reference to FIG. 24.

Figure 24:
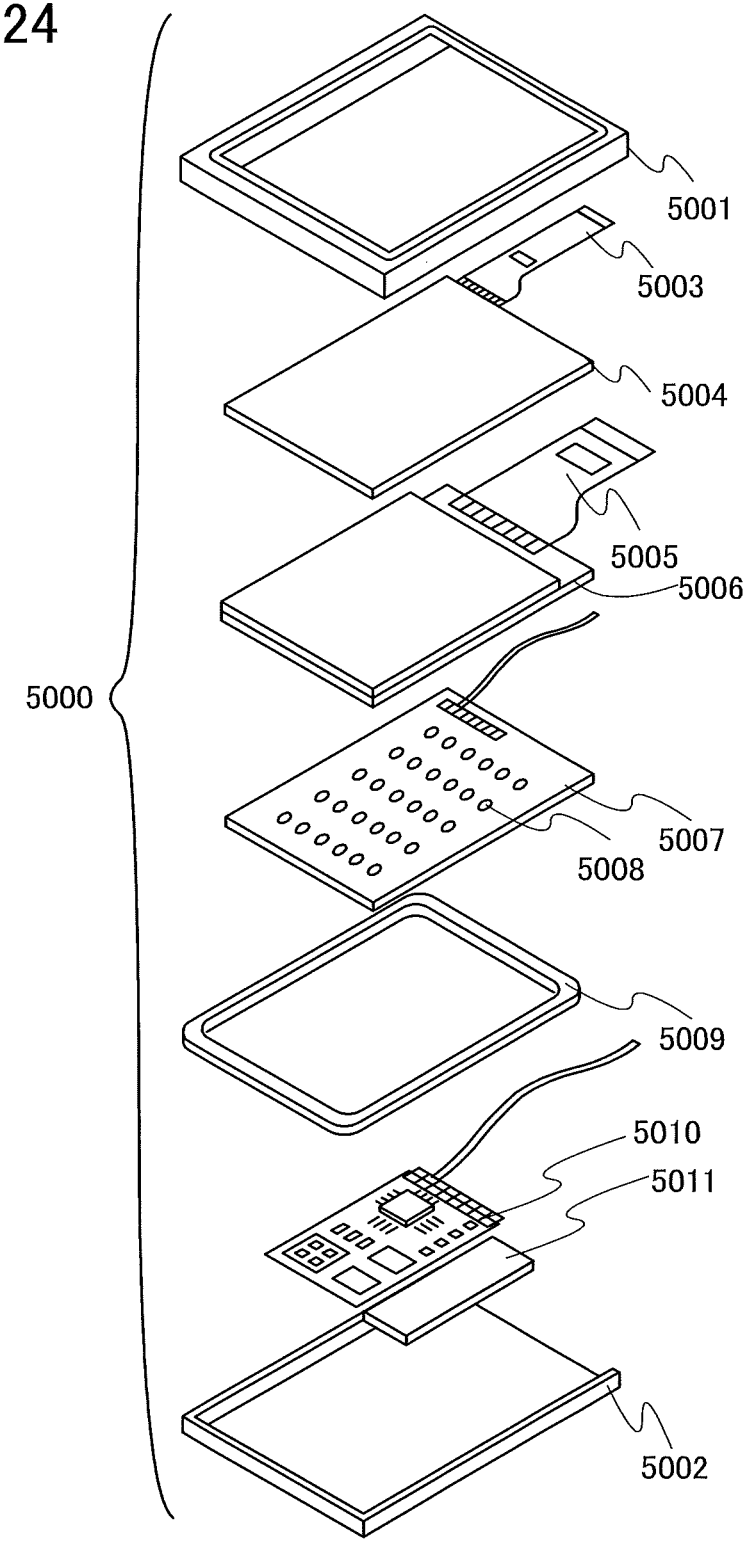
FIG. 24 illustrates a module using a light-emitting device of one embodiment of the present invention.

In a module 5000 illustrated in FIG. 24, a touch panel 5004 connected to an FPC 5003, a display panel 5006 connected to an FPC 5005, a backlight unit 5007, a frame 5009, a printed board 5010, and a battery 5011 are provided between an upper cover 5001 and a lower cover 5002.

The shapes and sizes of the upper cover 5001 and the lower cover 5002 can be changed as appropriate in accordance with the sizes of the touch panel 5004 and the display panel 5006.

The touch panel 5004 can be a resistive touch panel or a capacitive touch panel and can be formed to overlap with the display panel 5006. It is also possible to provide a touch panel function for a counter substrate (sealing substrate) of the display panel 5006. A photosensor may be provided in each pixel of the display panel 5006 so that an optical touch panel is obtained.

The backlight unit 5007 includes light sources 5008. Note that although a structure in which the light sources 5008 are provided over the backlight unit 5007 is illustrated in FIG. 24, one embodiment of the present invention is not limited to this structure. For example, a structure in which a light source 5008 is provided at an end portion of the backlight unit 5007 and a light diffusion plate is further provided may be employed.

The frame 5009 has a function of protecting the display panel 5006 and functions as an electromagnetic shield for blocking electromagnetic waves generated by the operation of the printed board 5010. The frame 5009 may function as a radiator plate.

The printed board 5010 has a power supply circuit and a signal processing circuit for outputting a video signal and a clock signal. As a power source for supplying electric power to the power supply circuit, an external commercial power source or a power source using a battery 5011 separately provided may be used. The battery 5011 can be omitted when a commercial power source is used.

The module 5000 can be additionally provided with a member such as a polarizing plate, a retardation plate, or a prism sheet.

Note that the structure described in this embodiment can be combined with any of the structures described in the other embodiments and the examples as appropriate.

(Embodiment 11)

In this embodiment, a structure of a light-emitting element of one embodiment of the present invention is described with reference to FIGS. 25A and 25B.

Figure 25A:
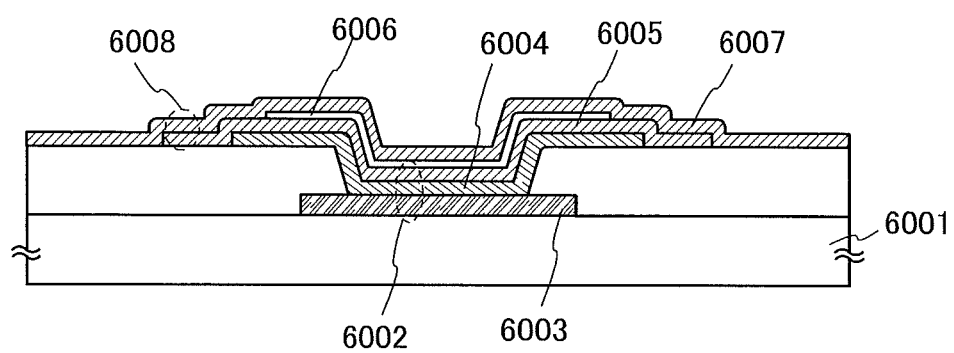
FIGS. 25A and 25B each illustrate a light-emitting element of one embodiment of the present invention.

A light-emitting element 6002 illustrated in FIG. 25A is formed over a substrate 6001. The light-emitting element 6002 includes a first electrode 6003, an EL layer 6004, and a second electrode 6005. In a light-emitting device illustrated in FIG. 25A, a buffer layer 6006 is formed over the second electrode 6005, and a third electrode 6007 is formed over the buffer layer 6006. The buffer layer 6006 can prevent a decrease in light-extraction efficiency due to surface plasmon generated on a surface of the second electrode 6005.

Note that the second electrode 6005 and the third electrode 6007 are electrically connected to each other in a contact portion 6008. The position of the contact portion 6008 is not limited to the position in the drawing, and may be formed in a light-emitting region.

The first electrode 6003 may be an anode and the second electrode 6005 may be a cathode, or alternatively, the first electrode 6003 may be a cathode and the second electrode 6005 may be an anode. At least one of the electrodes has a light-transmitting property, and both of the electrodes may be formed with light-transmitting materials. In the case where the first electrode 6003 has a function of transmitting light from the EL layer 6004, a transparent conductive film such as ITO can be used for the first electrode 6003. In the case where the first electrode 6003 blocks light from the EL layer 6004, a conductive film formed by stacking a plurality of layers (e.g., ITO and silver) can be used for the first electrode 6003.

In a structure in which light from the EL layer 6004 is extracted on the first electrode 6003 side, the thickness of the second electrode 6005 is preferably smaller than the thickness of the third electrode 6007. In a structure in which the light is extracted on the opposite side, the thickness of the second electrode 6005 is preferably larger than the thickness of the third electrode 6007. However, the thickness is not limited thereto.

For the buffer layer 6006, an organic resin film (e.g., Alq (abbreviation)), an inorganic insulating material (e.g., a silicon nitride film), or the like can be used.

Figure 25B:
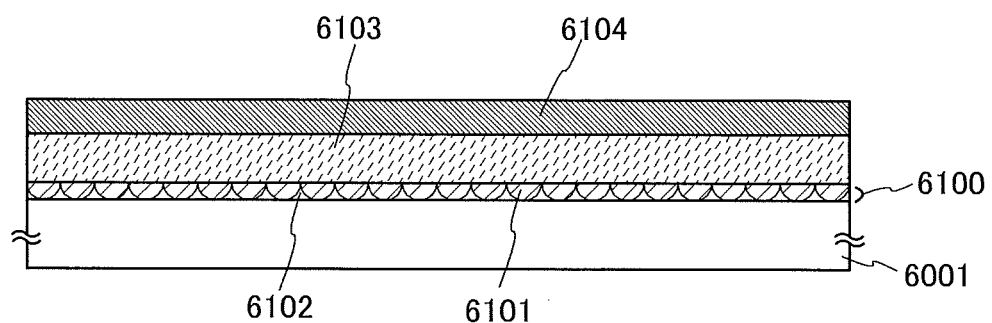

The light-extraction efficiency may be improved by employing a structure illustrated in FIG. 25B as a structure including the light-emitting element of one embodiment of the present invention.

In the structure illustrated in FIG. 25B, a light scattering layer 6100 including a light scatterer 6101 and an air layer 6102 is formed in contact with the substrate 6001; a high refractive index layer 6103 formed with an organic resin is formed in contact with the light scattering layer 6100; and an element layer 6104 including a light-emitting element and the like is formed in contact with the high refractive index layer 6103.

For the light scatterer 6101, particles of ceramic or the like can be used. For the high refractive index layer 6103, a high refractive index (e.g., refractive index of 1.7 to 1.8) material such as polyethylene naphthalate (PEN) can be used.

The element layer 6104 includes the light-emitting element described in this specification and the like.

EXAMPLE 1

Figure 9:
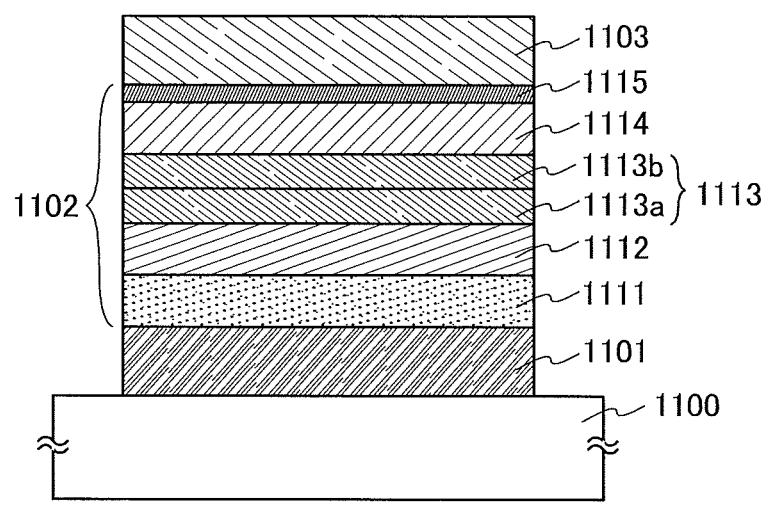
FIG. 9 illustrates a structure of a light-emitting element.

In this example, a light-emitting element 1 and a comparative light-emitting element 2 which are embodiments of the present invention are described with reference to FIG. 9. Chemical formulae of materials used in this example are shown below.

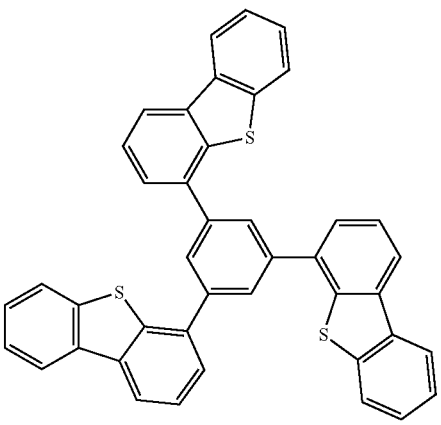

DBT3P-II

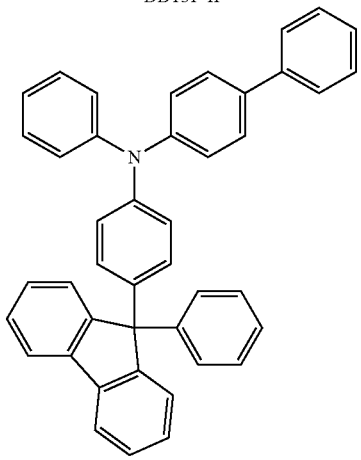

BPAFLP

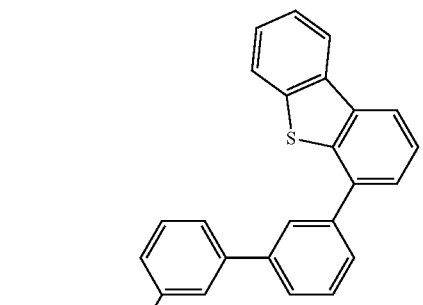

2mDBTBPDB-II

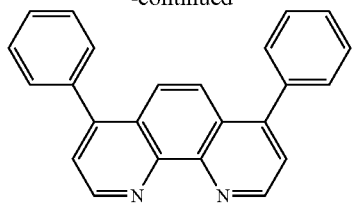

BPhen

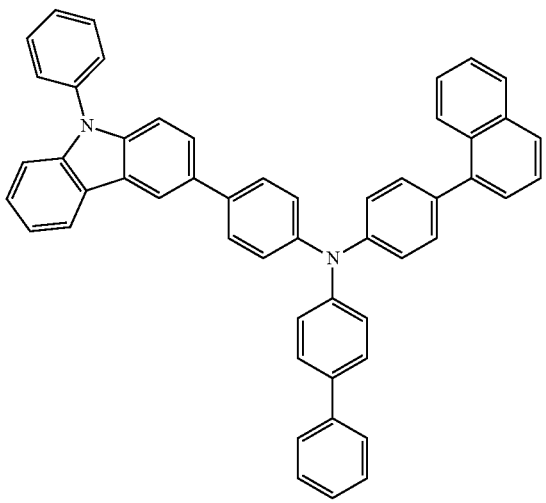

PCBBiNB

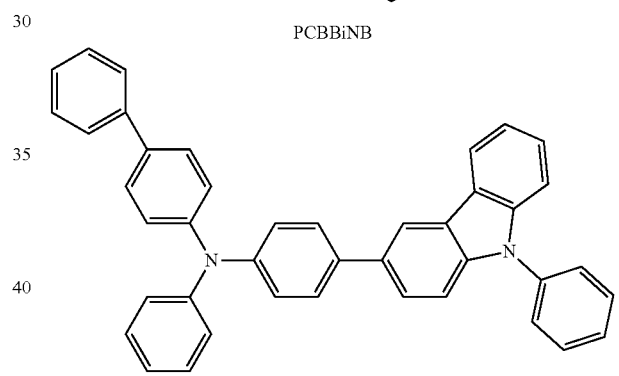

PCBA1BP

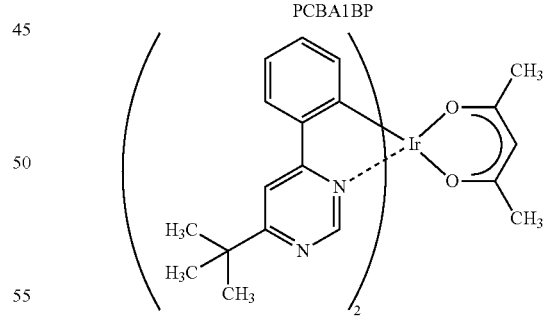

[Ir(tBuppm)$_2$(acac)]

<<Fabrication of Light-Emitting Element 1 and Comparative Light-Emitting Element 2>>

First, a film of indium oxide-tin oxide containing silicon oxide (ITSO) was formed over a glass substrate 1100 by a sputtering method, so that a first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for 1 hour, and subjected to UV ozone treatment for 370 seconds.

After that, the substrate 1100 was transferred into a vacuum evaporation apparatus in which the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in the vacuum evaporation apparatus so that the surface provided with the first electrode 1101 faced downward. In this example, a case is described in which a hole-injection layer 1111, a hole-transport layer 1112, a light-emitting layer 1113, an electron-transport layer 1114, and an electron-injection layer 1115 which are included in an EL layer 1102 are sequentially formed by a vacuum evaporation method.

After reducing the pressure in the vacuum evaporation apparatus to $10^{-4}$ Pa, 1,3,5-tri(dibenzothiophen-4-yl)benzene (abbreviation: DBT3P-II) and molybdenum(VI) oxide were co-evaporated with a mass ratio of DBT3P-II (abbreviation) to molybdenum oxide being 1:0.5, whereby the hole-injection layer 1111 was formed over the first electrode 1101. The thickness was 20 nm. Note that a co-evaporation method is an evaporation method in which a plurality of different substances is concurrently vaporized from respective different evaporation sources.

Then, 4-phenyl-4'-(9-phenylfluoren-9-yl)triphenylamine (abbreviation: BPAFLP) was evaporated to a thickness of 20 nm, so that the hole-transport layer 1112 was formed.

Next, the light-emitting layer 1113 was formed over the hole-transport layer 1112. For the light-emitting element 1, 2-[3'-(dibenzothiophen-4-yl)biphenyl-3-yl]dibenzo[f,h]quinoxaline (abbreviation: 2mDBTBPDBq-II), 4-(1-naphthyl)-4'-phenyl-4"-(9-phenyl-9H-carbazol-3-yl)triphenylamine (abbreviation: PCBBiNB), and (acetylacetonato)bis(6-tert-butyl-4-phenylpyrimidinato)iridium(III) (abbreviation: [Ir(tBuppm)$_2$(acac)]) were co-evaporated to a thickness of 20 nm with a mass ratio of 2nmDBTBPDBq-II to PCBBiNB and [Ir(tBuppm)$_2$(acac)] being 0.7:0.3:0.06, and then further co-evaporated to a thickness of 20 nm with a mass ratio of 2mDBTBPDBq-II to PCBBiNB and [Ir(tBuppm)$_2$(acac)] being 0.8:0.2:0.06; thus, the light-emitting layer 1113 was formed.

For the comparative light-emitting element 2, 2mDBTBP-DBq-II, 4-phenyl-4'-(9-phenyl-9H-carbazol-3-yl)triphenylamine (abbreviation: PCBA1BP), and [Ir(tBuppm)$_2$(acac)] were co-evaporated to a thickness of 20 nm with a mass ratio of 2mDBTBPDBq-II to PCBA1BP and [Ir(tBuppm)$_2$(acac)] being 0.7:0.3:0.06, and then further co-evaporated to a thickness of 20 nm with a mass ratio of 2mDBTBPDBq-II to PCBA1BP and [Ir(tBuppm)$_2$(acac)] being 0.8:0.2:0.06; thus, the light-emitting layer 1113 was formed.

Then, 2mDBTBPDBq-II was evaporated to a thickness of 10 nm over the light-emitting layer 1113 and bathophenanthroline (abbreviation: Bphen) was evaporated to a thickness of 15 nm, whereby the electron-transport layer 1114 having a stacked structure was formed. Furthermore, lithium fluoride was evaporated to a thickness of 1 nm over the electron-transport layer 1114, whereby the electron-injection layer 1115 was formed.

Finally, aluminum was evaporated to a thickness of 200 nm over the electron-injection layer 1115 to form a second electrode 1103 serving as a cathode; thus, the light-emitting element 1 and the comparative light-emitting element 2 were obtained. Note that, in the above evaporation process, evaporation was all performed by a resistance heating method.

In the above-described manner, the light-emitting element 1 and the comparative light-emitting element 2 were obtained. Table 1 shows element structures of the light-emitting element 1 and the comparative light-emitting element 2.

TABLE 1

| | First electrode | Hole-injection layer | Hole-transport layer | Light-emitting layer | | | Electron-transport layer | | Electron-injection layer | Second electrode |
|---|---|---|---|---|---|---|---|---|---|---|
| Light-emitting element 1 | ITSO (110 nm) | DBT3P-II:MoOx (1:0.5 20 nm) | BPAFLP (20 nm) | * | ** | | 2mDBTBPDBq-II (10 nm) | Bphen (15 nm) | LiF (1 nm) | Al (200 nm) |
| Comparative light-emitting element 2 | | | | *** | **** | | | | | |

\* 2mDBTBPDBq-II:PCBBiNB:[Ir(tBuppm)$_2$(acac)] (0.7:0.3:0.06 20 nm)
\*\* 2mDBTBPDBq-II:PCBBiNB:[Ir(tBuppm)$_2$(acac)] (0.8:0.2:0.06 20 nm)
\*\*\* 2mDBTBPDBq-II:PCBA1BP:[Ir(tBuppm)$_2$(acac)] (0.7:0.3:0.06 20 nm)
\*\*\*\* 2mDBTBPDBq-II:PCBA1BP:[Ir(tBuppm)$_2$(acac)] (0.8:0.2:0.06 20 nm)

The fabricated light-emitting element 1 and comparative light-emitting element 2 were sealed in a glove box containing a nitrogen atmosphere so as not to be exposed to the air (specifically, a sealant was applied onto outer edges of the elements and heat treatment was performed at 80° C. for 1 hour at the time of sealing).

<<Operation Characteristics of Light-Emitting Element 1 and Comparative Light-Emitting Element 2>>

Operation characteristics of the fabricated light-emitting element 1 and comparative light-emitting element 2 were measured. Note that the measurement was carried out at room temperature (in an atmosphere kept at 25° C.).

Figure 10:
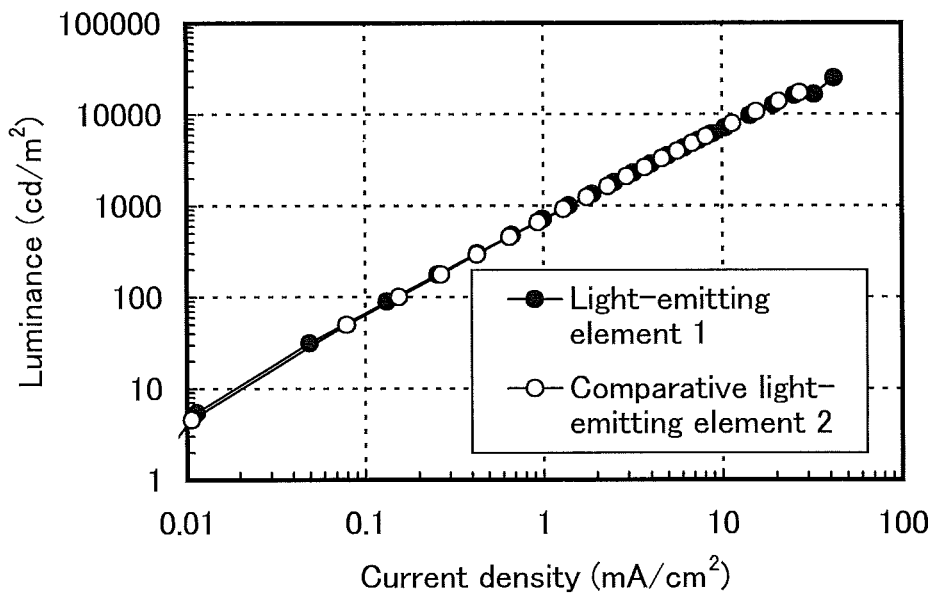
FIG. 10 shows current density versus luminance characteristics of a light-emitting element 1 and a comparative light-emitting element 2.
Figure 11:
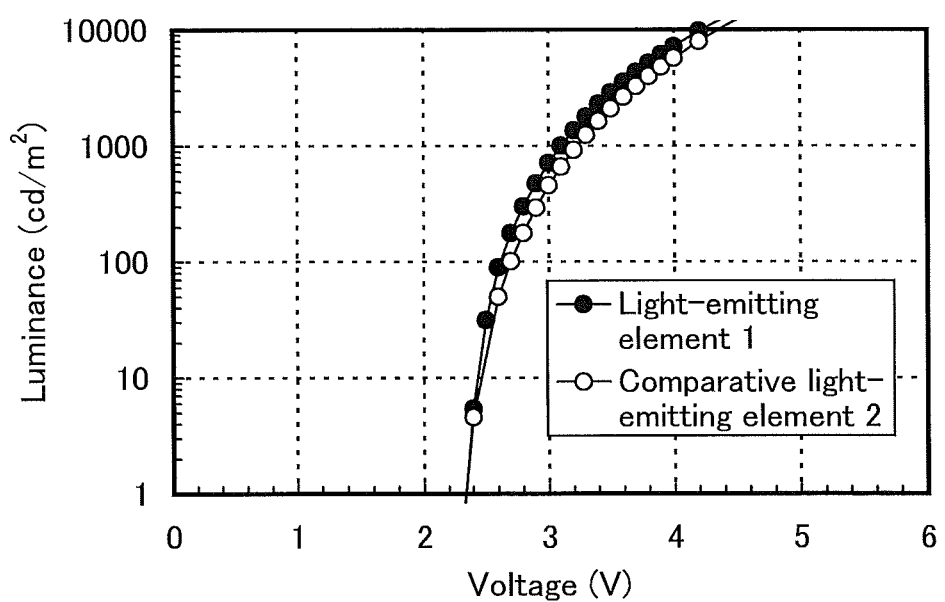
FIG. 11 shows voltage versus luminance characteristics of the light-emitting element 1 and the comparative light-emitting element 2.
Figure 12:
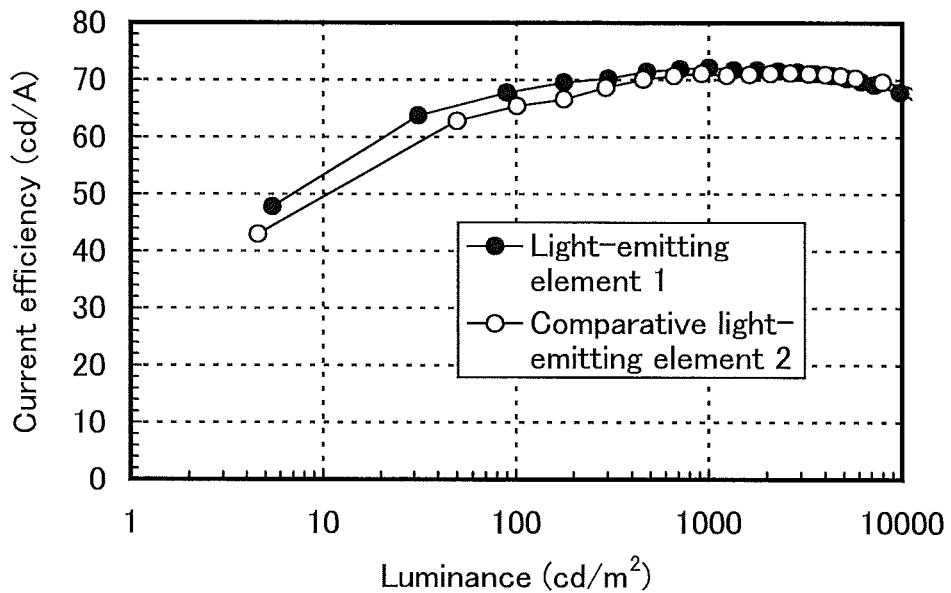
FIG. 12 shows luminance versus current efficiency characteristics of the light-emitting element 1 and the comparative light-emitting element 2.
Figure 13:
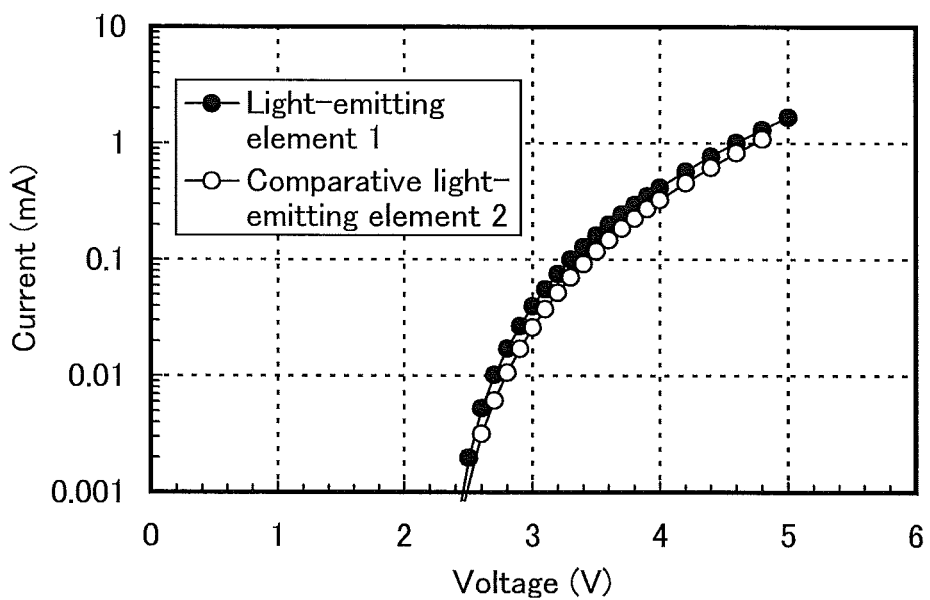
FIG. 13 shows voltage versus current characteristics of the light-emitting element 1 and the comparative light-emitting element 2.

FIG. 10 shows current density versus luminance characteristics of the light-emitting element 1 and the comparative light-emitting element 2. In FIG. 10, the vertical axis represents luminance (cd/m$^2$) and the horizontal axis represents current density (mA/cm$^2$). FIG. 11 shows voltage versus luminance characteristics of the light-emitting element 1 and the comparative light-emitting element 2. In FIG. 11, the vertical axis represents luminance (cd/m$^2$) and the horizontal axis represents voltage (V). FIG. 12 shows luminance versus current efficiency characteristics of the light-emitting element 1 and the comparative light-emitting element 2. In FIG. 12, the vertical axis represents current efficiency (cd/A) and the horizontal axis represents luminance (cd/m$^2$). FIG. 13 shows voltage versus current characteristics of the light-emitting element 1 and the comparative light-emitting element 2.

In FIG. 13, the vertical axis represents current (mA) and the horizontal axis represents voltage (V).

The results of FIG. 10, FIG. 11, FIG. 12, and FIG. 13 reveal the following: there is little difference in element characteristics between the light-emitting element 1 of one embodiment of the present invention and the comparative light-emitting element 2; the light-emitting element 1 has favorable characteristics (see Table 3 given below) though in a light-emitting layer of the light-emitting element 1, PCBBiNB whose T1 level is lower than that of [Ir(tBuppm)$_2$(acac)] is used as a host material and [Ir(tBuppm)$_2$(acac)] is used as a guest material while in a light-emitting layer of the comparative light-emitting element 2, PCBA1BP whose T1 level is higher than that of [Ir(tBuppm)$_2$(acac)] is used as a host material.

Table 2 shows initial values of main characteristics of the light-emitting element 1 and the comparative light-emitting element 2 at a luminance of about 1000 cd/m$^2$.

TABLE 2

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting element 1 | 3.1 | 0.056 | 1.4 | (0.41, 0.58) | 1000 | 72 | 73 | 20 |
| Comparative light-emitting element 2 | 3.2 | 0.052 | 1.3 | (0.41, 0.58) | 920 | 71 | 70 | 20 |

The above results in Table 2 also show that each of the light-emitting element 1 and the comparative light-emitting element 2 fabricated in this example has high quantum efficiency.

Figure 14:
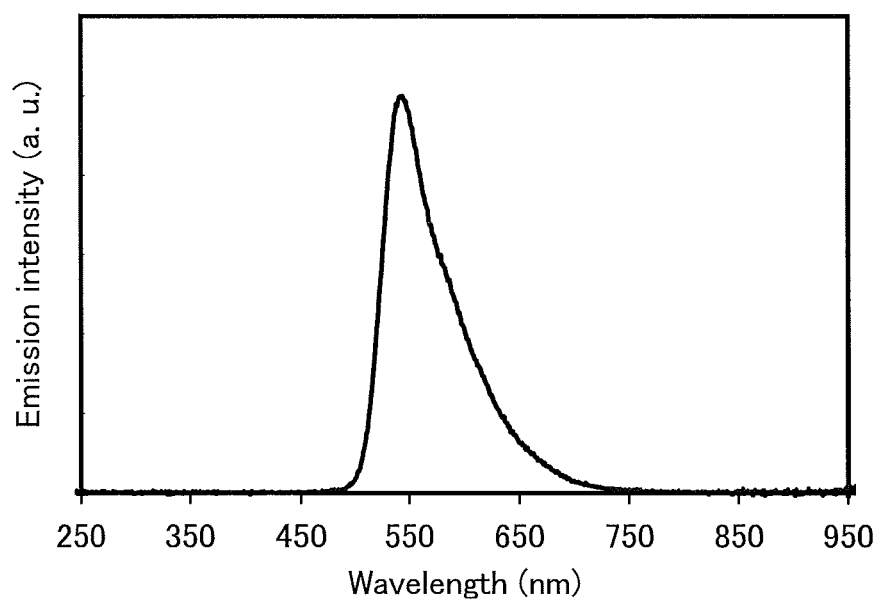
FIG. 14 shows an emission spectrum of the light-emitting element 1.

FIG. 14 shows an emission spectrum of the light-emitting element 1 which was obtained when a current of 0.1 mA flowed in the light-emitting element 1. As shown in FIG. 14, the emission spectrum of the light-emitting element 1 has a peak at around 546 nm, which indicates that the emission spectrum is derived from emission of [Ir(tBuppm)$_2$(acac)] contained in the light-emitting layer 1113.

Figure 15:
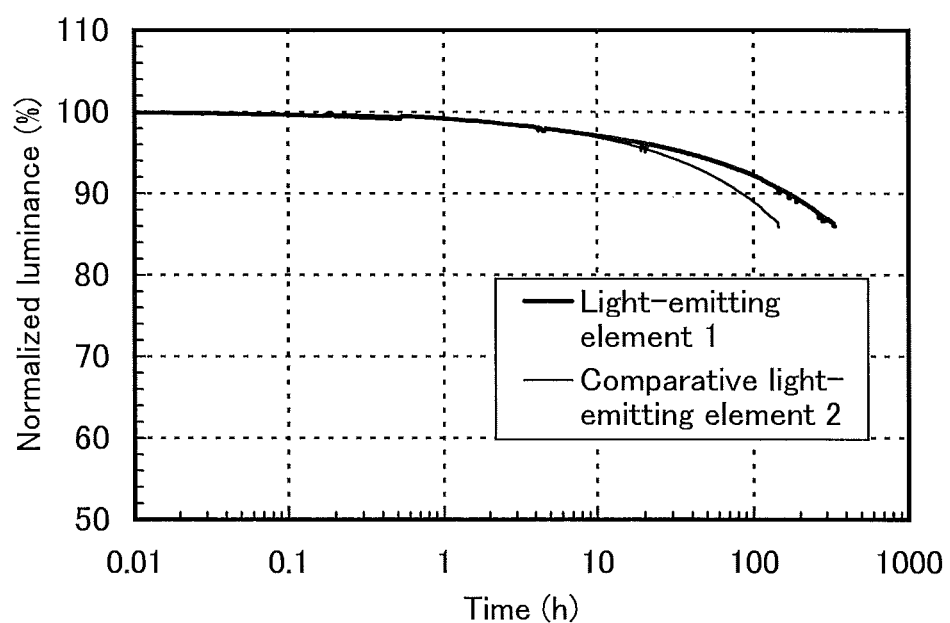
FIG. 15 shows reliability of each of the light-emitting element 1 and the comparative light-emitting element 2.

Next, reliability tests of the light-emitting element 1 and the comparative light-emitting element 2 were conducted. FIG. 15 shows results of the reliability tests. In FIG. 15, the vertical axis represents normalized luminance (%) with an initial luminance of 100%, and the horizontal axis represents driving time (h) of the elements. Note that in the reliability tests, the light-emitting element 1 and the comparative light-emitting element 2 were driven under the conditions that the initial luminance was set to 5000 cd/m$^2$ and the current density was constant. As a result, the luminance of the light-emitting element 1 after 100-hour driving was about 92% of the initial luminance; thus, the light-emitting element 1 kept higher luminance than that of the comparative light-emitting element 2.

The above reliability tests show that the light-emitting element 1 of one embodiment of the present invention has high reliability and a long lifetime.

Figure 16:
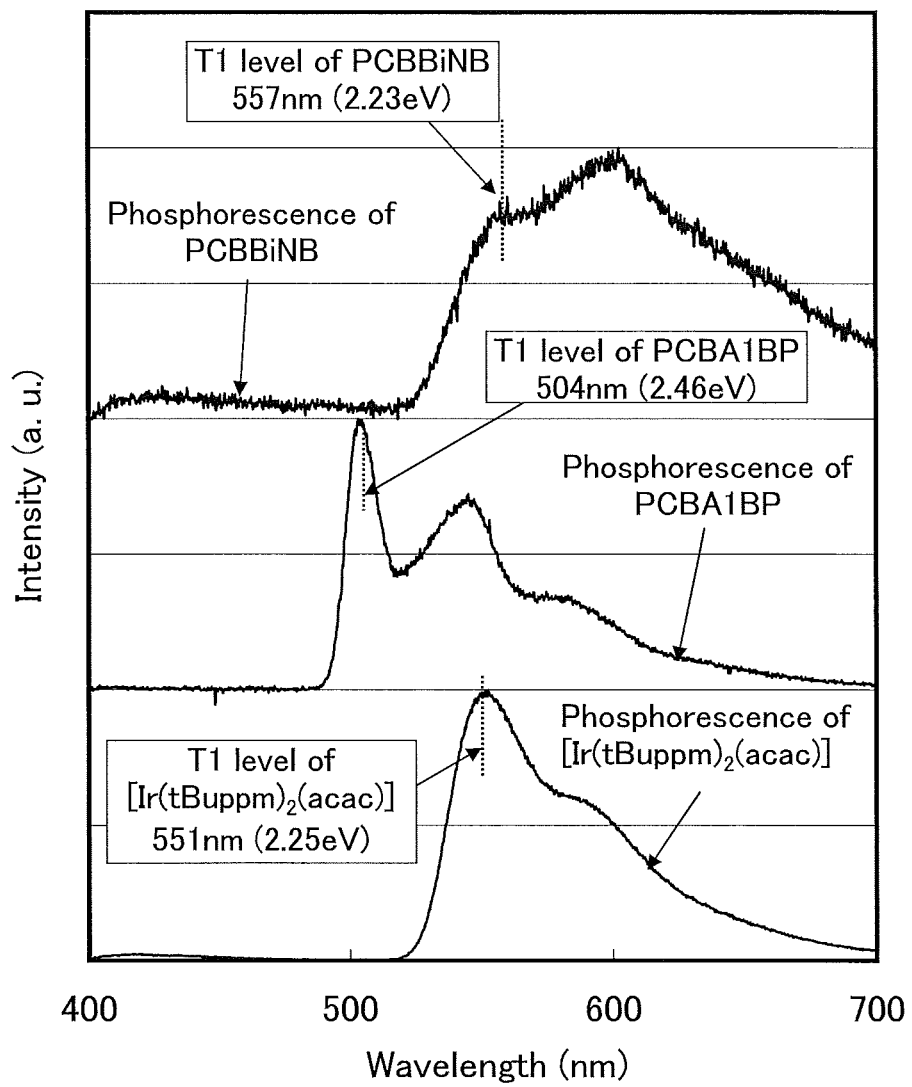
FIG. 16 shows phosphorescence spectra of the light-emitting elements.

FIG. 16 shows measurement results of the T1 levels of PCBBiNB used in the light-emitting layer of the light-emitting element 1, PCBA1BP used in the light-emitting layer of the comparative light-emitting element 2, and [Ir(tBuppm)$_2$(acac)] used in the light-emitting layers of the light-emitting element 1 and the comparative light-emitting element 2 in this example.

Note that the T1 levels were obtained by measurement of emission of phosphorescence from the materials. In the measurement, each material was irradiated with excitation light with a wavelength of 325 nm and the measurement temperature was 10 K. Note that time-resolved measurement using mechanical choppers was employed for PCBBiNB and PCBA1BP while normal phosphorescence measurement without conducting time-resolved measurement was employed for [Ir(tBuppm)$_2$(acac)]. In measuring an energy level, calculation from an absorption wavelength is more accurate than calculation from an emission wavelength. However, here, absorption of the T1 level was extremely low and measuring it is difficult; thus, the T1 level was measured by measuring an emission wavelength. For this reason, a few errors may be included in the measured values.

Table 3 shows the measurement results.

TABLE 3

| | PCBBiNB | PCBA1BP | [Ir(tBuppm)$_2$(acac)] |
|---|---|---|---|
| T1 level | 2.23 eV (557 nm) | 2.46 eV (504 nm) | 2.25 eV (551 nm) |

Thus, it was confirmed that in the light-emitting element 1 using PCBBiNB as a host material, the T1 level of the host material is lower than the T1 level of a guest material, and in the comparative light-emitting element 2 using PCBA1BP as a host material, the T1 level of the host material is higher than the T1 level of a guest material. According to the above results, it is found that the light-emitting element 1 using PCBBiNB, which is chemically stable and has low T1 level, has element characteristics as good as those of the comparative light-emitting element 2.

EXAMPLE 2

In this example, a mass ratio of samples in which an organic film (thickness: 50 nm) was provided between quartz substrates were fabricated. For the organic film, PCBBiNB (abbreviation), PCBA1BP (abbreviation), and [Ir(tBuppm)$_2$(acac)](abbreviation), which were contained in at least one of the light-emitting layers of the light-emitting element 1 and the comparative light-emitting element 2 in Example 1, were used, and the composition of these materials was made to be different among the samples. The lifetime ($\tau_1$, $\tau_2$) [μsec] of each sample was measured.

The mass ratio in the organic film was such that 2mDBT-BPDBq-II: PCBBiNB (or PCBA1BP): [Ir(tBuppm)$_2$(acac)]=1-X:X:0.06. Table 4 shows the structures of the samples.

TABLE 4

| Sample | X | τ1 [μsec] | τ2 [μsec] |
|---|---|---|---|
| 1 | 0 (PCBBiNB: 0%) | 1.15 | — |
| 2 | 0.2 (PCBBiNB: 20%) | 1.01 | 1.81 |
| 3 | 0.5 (PCBBiNB: 50%) | 0.96 | 2.21 |
| 4 | 1 (PCBBiNB: 100%) | 1.00 | 3.42 |
| 5 | 1 (PCBA1BP: 50%) | 1.20 | — |

Figure 17:
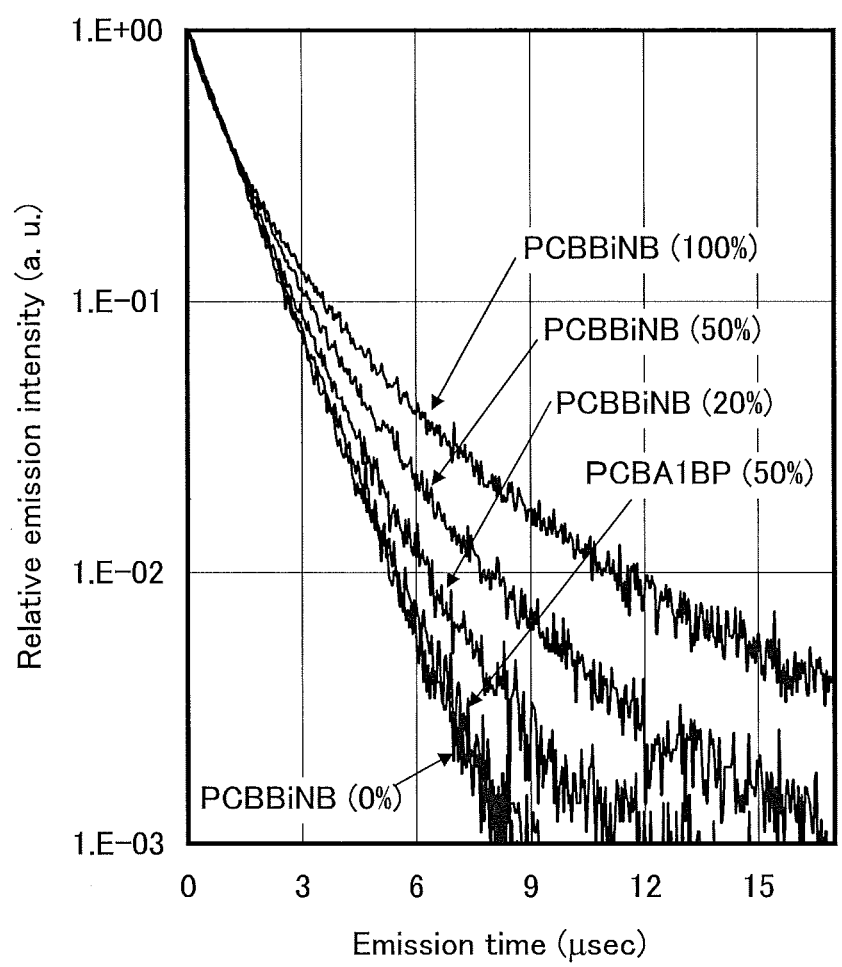
FIG. 17 shows emission times of the light-emitting elements.

For the measurement, each sample was irradiated with excited light having a wavelength of 337 nm (500 ps), the hole size was set to 100 μm, and the measurement time was set in a range of 0 μsec to 20 μsec. FIG. 17 shows the measurement results.

The results in FIG. 17 indicate that in the case where PCBA1BP whose T1 level is higher than that of [Ir(tBuppm)$_2$(acac)] serving as a guest material is used as a host material, the lifetime is represented by a one-component decay curve. On the other hand, in the case where PCBBiNB whose T1 level is lower than that of [Ir(tBuppm)$_2$(acac)] serving as a guest material is used as a host material, the lifetime is represented by a two-component decay curve. A short lifetime component (τ1) of PCBBiNB is shorter and a long lifetime component (τ2) of PCBBiNB is longer than the lifetime of the sample in which PCBA1BP is used as a host material. The lifetime of the long lifetime component (τ2) becomes longer as the proportion of PCBBiNB increases. This is because the short lifetime component (τ1) of PCBBiNB is the sum of an emission rate of the guest material and a transfer rate of exciton energy to the host material, and the long lifetime component (τ2) of PCBBiNB is a result of energy transfer from the host material to the guest material.

Thus, one feature of the light-emitting element of one embodiment of the present invention is that a multicomponent decay curve like the one shown in FIG. 17 can be obtained in the case of using a host material whose T1 level is lower than that of a guest material.

EXPLANATION OF REFERENCE

10: exciton, 11: host material, 12: guest material, 101: anode, 102: cathode, 103: EL layer, 104: light-emitting layer, 105: first organic compound (serving as a host material), 106: second organic compound (serving as a guest material), 201: first electrode, 202: second electrode, 203: EL layer, 204: hole-injection layer, 205: hole-transport layer, 206: light-emitting layer, 207: electron-transport layer, 208: electron-injection layer, 209: first organic compound (serving as a host material), 210: second organic compound (serving as a guest material), 301: first electrode, 302(1): first EL layer, 302(2): second EL layer, 304: second electrode, 305: charge-generation layer, 305(1): first charge-generation layer, 305(2): second charge-generation layer, 501: element substrate, 502: pixel portion, 503: driver circuit portion (source line driver circuit), 504a, 504b: driver circuit portion (gate line driver circuit), 505: sealant, 506: sealing substrate, 507: wiring, 508: FPC (flexible printed circuit), 509: n-channel FET, 510: p-channel FET, 511: switching FET, 512: current control FET, 513: first electrode (anode), 514: insulator, 515: EL layer, 516: second electrode (cathode), 517: light-emitting element, 518: element layer, 1100: substrate, 1101: first electrode, 1102: EL layer, 1103: second electrode, 1111: hole-injection layer, 1112: hole-transport layer, 1113: light-emitting layer, 1114: electron-transport layer, 1115: space, 2001: first substrate, 2002: light-emitting portion, 2005a: first sealant, 2005b: second sealant, 2006: second substrate, 2011: second space, 2013: first space, 3000: light-emitting device, 3001: substrate, 3002a: reflective electrode, 3002b: reflective electrode, 3002c: reflective electrode, 3003a: lower electrode, 3003b: lower electrode, 3003c: lower electrode, 3005a: transparent conductive layer, 3005b: transparent conductive layer, 3005c: transparent conductive layer, 3007a: partition wall, 3007b: partition wall, 3007c: partition wall, 3007d: partition wall, 3009: hole-injection layer, 3011a: hole-transport layer, 3011b: hole-transport layer, 3011c: hole-transport layer, 3013a: light-emitting layer, 3013b: light-emitting layer, 3013c: light-emitting layer, 3015a: electron-transport layer, 3015b: electron-transport layer, 3015c: electron-transport layer, 3017: electron-injection layer, 3019: upper electrode, 3020a: light-emitting element, 3020b: light-emitting element, 3020c: light-emitting element, 3100: light-emitting device, 3101: substrate, 3102a: reflective electrode, 3102b: reflective electrode, 3102c: reflective electrode, 3103a: lower electrode, 3103b: lower electrode, 3103c: lower electrode, 3103d: lower electrode, 3105a: transparent conductive layer, 3105b: transparent conductive layer, 3107a: partition wall, 3107b: partition wall, 3107c: partition wall, 3107d: partition wall, 3110: hole-injection and hole-transport layer, 3112: first light-emitting layer, 3114: charge-generation layer, 3116: second light-emitting layer, 3118: electron-transport and electron-injection layer, 3119: upper electrode, 3120a: light-emitting element, 3120b: light-emitting element, 3120c: light-emitting element, 4000: lighting device, 4001: lighting device, 4003: substrate, 4005: substrate, 4007: light-emitting element, 4009: electrode, 4011: electrode, 4013: lower electrode, 4014: EL layer, 4015: upper electrode, 4017: auxiliary wiring, 4019: sealing substrate, 4021: sealant, 4023: desiccant, 4025: substrate, 4027: diffusing plate, 4100: lighting device, 4101: lighting device, 4103: sealing substrate, 4105: planarization film, 4107: light-emitting element, 4109: electrode, 4111: electrode, 4113: lower electrode, 4114: EL layer, 4115: upper electrode, 4117: auxiliary wiring, 4121: sealant, 4125: substrate, 4127: diffusing plate, 4129: barrier film, 4131: insulating layer, 4500: touch sensor, 4510: conductive layer, 4510a: conductive layer, 4510b: conductive layer, 4510c: conductive layer, 4520: conductive layer, 4540: capacitance, 4710: electrode, 4810: insulating layer, 4820: insulating layer, 4910: substrate, 4920: substrate, 5000: module, 5001: upper cover, 5002: lower cover, 5003: FPC, 5004: touch panel, 5005: FPC, 5006: display panel, 5007: backlight unit, 5008: light source, 5009: frame, 5010: printed board, 5011: battery, 6001: substrate, 6002: light-emitting element, 6003: first electrode, 6004: EL layer, 6005: second electrode, 6006: buffer layer, 6007: third electrode, 6008: contact portion, 6100: light scattering layer, 6101: light scatterer, 6102: air layer, 6103: high refractive index layer, 6104: electron-injection layer, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: mobile phone device, 7401: housing, 7402: display portion, 7403: operation button, 7404: external connection port, 7405: speaker, 7406: microphone, 8001: lighting device, 8002: lighting device, 8003: lighting device, 8004:

lighting device, 9033: clasp, 9034: display mode switch, 9035: power supply switch, 9036: power saver switch, 9038: operation switch, 9630: housing, 9631: display portion, 9631a: display portion, 9631b: display portion, 9632a: touch panel region, 9632b: touch panel region, 9633: solar cell, 9634: charge/discharge control circuit, 9635: battery, 9636: DC-DC converter, 9637: operation key, 9638: converter, 9639: button This application is based on Japanese Patent Application serial no. 2013-002296 filed with Japan Patent Office on Jan. 10, 2013, the entire contents of which are hereby incorporated by reference.

The invention claimed is:

1. A light-emitting device comprising:
   a light-emitting layer comprising at least a first organic compound, a second organic compound, and a third organic compound,
   wherein the first organic compound is guest material,
   wherein a T1 level of the first organic compound is equal to or higher than a T1 level of the second organic compound,
   wherein the T1 level of the first organic compound is equal to or lower than a T1 level of the third organic compound,
   wherein emission time-dependence of emission intensity of the light-emitting device is represented by a multicomponent decay curve, and
   wherein an emission time of a longest lifetime component of the multicomponent decay curve is less than or equal to 15 μsec where the emission time is a time required for a value of initial emission intensity to become 1/100.

2. The light-emitting device according to claim 1, wherein the light-emitting device is configured to emit blue light.

3. An electronic device comprising the light-emitting device according to claim 1.

4. A lighting device comprising the light-emitting device according to claim 1.

5. The light-emitting device according to claim 1, wherein a difference between the T1 level of the first organic compound and the T1 level of the second organic compound is greater than or equal to 0 eV and less than or equal to 0.2 eV.

6. The light-emitting device according to claim 1, wherein the first organic compound is a phosphorescence compound.

7. A light-emitting device comprising:
   a light-emitting layer comprising at least a first organic compound, a second organic compound, and a third organic compound,
   wherein the first organic compound is guest material,
   wherein each of the second organic compound and the third organic compound is host material,
   wherein a T1 level of the first organic compound is equal to or higher than a T1 level of the second organic compound,
   wherein the T1 level of the first organic compound is equal to or lower than a T1 level of the third organic compound,
   wherein the first organic compound and the second organic compound are selected so that emission time-dependence of emission intensity of the light-emitting device is represented by a multicomponent decay curve, and
   wherein an emission time of a longest lifetime component of the multicomponent decay curve is less than or equal to 15 μsec where the emission time is a time required for a value of initial emission intensity to become 1/100.

8. The light-emitting device according to claim 7, wherein the multicomponent decay curve represents at least two components derived from the first organic compound and/or the second organic compound at the time when the value of initial emission intensity becomes 1/100.

9. The light-emitting device according to claim 7, wherein the light-emitting device is configured to emit blue light.

10. An electronic device comprising the light-emitting device according to claim 7.

11. A lighting device comprising the light-emitting device according to claim 7.

12. The light-emitting device according to claim 7, wherein a difference between the T1 level of the first organic compound and the T1 level of the second organic compound is greater than or equal to 0 eV and less than or equal to 0.2 eV.

13. The light-emitting device according to claim 7, wherein the first organic compound is a phosphorescence compound.

14. A light-emitting device comprising:
   a light-emitting layer comprising a guest material, a first host material, and a second host material,
   wherein a T1 level of the guest material is equal to or higher than a T1 level of the first host material,
   wherein the T1 level of the guest material is equal to or lower than a T1 level of the second host material,
   wherein the guest material, the first host material and the second host material are selected so that emission time-dependence of emission intensity of the light-emitting device is represented by a multicomponent decay curve, and
   wherein an emission time of a longest lifetime component of the multicomponent decay curve is less than or equal to 15 μsec where the emission time is a time required for a value of initial emission intensity to become 1/100.

15. The light-emitting device according to claim 14, wherein a difference between the T1 level of the guest material and the T1 level of the first host material is greater than or equal to 0 eV and less than or equal to 0.2 eV.

16. The light-emitting device according to claim 14, wherein the guest material is a phosphorescence compound.

17. The light-emitting device according to claim 14, wherein the multicomponent decay curve represents at least two components derived from the guest material at the time when the value of initial emission intensity becomes 1/100.

18. The light-emitting device according to claim 14, wherein the light-emitting device is configured to emit blue light.

19. An electronic device comprising the light-emitting device according to claim 14.

20. A lighting device comprising the light-emitting device according to claim 14.

* * * * *